US012803411B2

(12) United States Patent
Lai et al.

(10) Patent No.: US 12,803,411 B2
(45) Date of Patent: Nov. 17, 2026

(54) PHASE POWER SUPPLY PATH SWITCHING CIRCUIT

(71) Applicants: Chicony Power Technology Co., Ltd., New Taipei City (TW); National Taipei University of Technology, Taipei (TW)

(72) Inventors: Yen-Shin Lai, Taipei City (TW); Min-Hung Zheng, Taipei City (TW); Yu-Xian Zeng, New Taipei City (TW)

(73) Assignees: CHICONY POWER TECHNOLOGY CO., LTD., New Taipei City (TW); NATIONAL TAIPEI UNIVERSITY OF TECHNOLOGY, Taipei (TW)

( * ) Notice: Subject to any disclaimer, the term of this patent is extended or adjusted under 35 U.S.C. 154(b) by 330 days.

(21) Appl. No.: 18/423,868

(22) Filed: Jan. 26, 2024

(65) Prior Publication Data

US 2025/0149968 A1 May 8, 2025

(30) Foreign Application Priority Data

Nov. 8, 2023 (TW) ................................ 112143107

(51) Int. Cl.
*H02M 1/00* (2007.01)
*H02M 1/32* (2007.01)
*H03K 17/687* (2006.01)

(52) U.S. Cl.
CPC ......... *H02M 1/0043* (2021.05); *H02M 1/325* (2021.05); *H03K 17/6874* (2013.01); *H03K 2217/0081* (2013.01)

(58) Field of Classification Search
CPC ... H02M 1/0043; H02M 1/0048–0058; H02M 1/0067; H02M 1/008;
(Continued)

(56) References Cited

U.S. PATENT DOCUMENTS 6,411,067 B1 6/2002 Björklund
6,603,647 B2 * 8/2003 Briesen ................ H02M 5/271 361/91.1

(Continued)

FOREIGN PATENT DOCUMENTS

CN 102570590 7/2012
CN 103532218 1/2014

(Continued)

*Primary Examiner* — Thienvu V Tran
*Assistant Examiner* — Carlos O Rivera-Perez
(74) *Attorney, Agent, or Firm* — Birch, Stewart, Kolasch & Birch, LLP

(57) ABSTRACT

A phase power supply path switching circuit includes three phase input ends, three phase output ends, a matrix switch unit, a detection unit, and a control unit. The matrix switch unit includes a plurality of bidirectional switches coupled between the three phase input ends and the three phase output ends. The detection unit is coupled to a first phase line, a second phase line, and a third phase line and detects voltages thereof. The control unit is coupled to the detection unit and the matrix switch unit, and controls, in response to detecting that a first line voltage between the first phase line and the second phase line is zero and a second line voltage between the second phase line and the third phase line is within a polarity half cycle, the plurality of bidirectional switches to switch a first phase power supply path with a second power supply path.

21 Claims, 17 Drawing Sheets

(58) Field of Classification Search
CPC ... H02M 1/02–047; H02M 1/08–0845; H02M 1/32; H02M 1/325; H02M 1/38; H02M 1/385; H02M 5/00; H02M 5/02; H02M 5/04; H02M 5/275; H02M 5/293; H02M 5/2932; H02M 5/2935; H02M 5/2937; H02M 5/297; H03K 17/6817; H03K 17/6872; H03K 17/6874; H03K 2217/0081; Y02E 40/50
USPC ............. 363/34, 36, 40–43, 50–58, 65, 123, 363/148–156, 159, 160; 323/212, 323/217–219, 235–239, 265, 266, 267, 323/268, 271–276, 282–285, 351
See application file for complete search history.

(56) References Cited

U.S. PATENT DOCUMENTS 9,112,414 B2 * 8/2015 Inomata ................ H02M 5/293
9,716,445 B2 7/2017 Li et al.
10,320,306 B1 * 6/2019 Blasko .................. H02M 5/297
11,750,111 B2 9/2023 Hsiao et al.
2003/0117761 A1 6/2003 Pebles et al.

FOREIGN PATENT DOCUMENTS

| | | |
|---|---|---|
| CN | 203775040 | 8/2014 |
| CN | 110635565 | 12/2019 |
| CN | 111033924 | 4/2020 |
| CN | 107863778 | 6/2020 |
| CN | 107846211 | 9/2020 |
| CN | 109474060 | 6/2021 |
| CN | 116760395 | 9/2023 |
| EP | 1247329 B1 | 1/2008 |
| TW | 201743535 | 12/2017 |
| TW | 202143598 | 11/2021 |
| TW | 202136964 | 2/2022 |
| TW | 202316765 | 4/2023 |
| WO | 2005119893 A1 | 12/2005 |

* cited by examiner

PHASE POWER SUPPLY PATH SWITCHING CIRCUIT

CROSS-REFERENCE TO RELATED APPLICATION

This non-provisional application claims priority under 35 U.S.C. § 119(a) to Patent Application No. 112143107 filed in Taiwan, R.O.C. on Nov. 8, 2023, the entire contents of which are hereby incorporated by reference.

BACKGROUND

Technical Field

The present disclosure relates to a switching control circuit, and in particular, to a phase power supply path switching circuit.

Related Art

Three phase power supplies may be supplied to different loads respectively. However, if a load of a specific phase power supply is too heavy and power consumption is too large, a loss of a power distribution device of the phase power supply is increased and a service life is reduced. However, at present, there is no solution for load balancing.

SUMMARY

The present disclosure provides a phase power supply path switching circuit that receives three phase power supplies from a power supply end and includes three phase input ends, three phase output ends, a matrix switch unit, a detection unit, and a control unit. The three phase input ends include a first phase input end, a second phase input end, and a third phase input end, which respectively receives the three phase power supplies from the power supply end. The three phase output ends include a first phase output end, a second phase output end, and a third phase output end. The matrix switch unit includes a plurality of bidirectional switches. Each of the plurality of bidirectional switches is coupled between one of the three phase input ends and one of the three phase output ends, where the first phase input end and the first phase output end are coupled through a first bidirectional switch in the plurality of bidirectional switches to form a first phase line, and the second phase input end and the second phase output end are coupled through a second bidirectional switch in the plurality of bidirectional switches to form a second phase line. The detection unit is configured to detect the first phase line, the second phase line, and a third phase line, where the third phase line is coupled between the third phase input end and the third phase output end. The control unit is coupled to the detection unit and the matrix switch unit, and is configured to, after receiving a switching signal, in response to detecting that a first line voltage between the first phase line and the second phase line is zero and a second line voltage between the second phase line and the third phase line is within a polarity half cycle, perform the following steps in sequence: (a) turning off first conduction directions of the first bidirectional switch and the second bidirectional switch, where the first conduction direction is opposite to a current direction of the polarity half cycle; (b) turning on second conduction directions of a third bidirectional switch and a fourth bidirectional switch in the polarity of bidirectional switches, where the second conduction direction is the same as the current direction of the polarity half cycle, the third bidirectional switch is coupled between the second phase input end and the first phase output end, and the fourth bidirectional switch is coupled between the first phase input end and the second phase output end; (c) turning off second conduction directions of the first bidirectional switch and the second bidirectional switch; and (d) turning on first conduction directions of the third bidirectional switch and the fourth bidirectional switch.

According to the phase power supply path switching circuit of some embodiments of the present disclosure, only voltage detection needs to be performed and current detection does not need to be performed, and there is no need to consider a phase sequence of the three phase power supplies. A time point for switching is determined by detecting two line voltages, so that the phase power supply path switching circuit is suitable for a variety of connection structures of the power supply end and the load end, and has the convenience and versatility of universal plug and play. After a phase power supply path is switched, loads of two coupled phase lines are exchanged with each other, so that load balancing is achieved. In addition, through a switch switching sequence in the foregoing steps, short circuit of the power supply end and open circuit of a load end are avoided during path switching. Moreover, use of the bidirectional switches achieves effects such as fast switching and zero current switching (flexible switching).

DETAILED DESCRIPTION

"Coupling" used in this specification refers to that two or more elements are in physical or electrical contact with each other "directly", or are in physical or electrical contact with each other "indirectly", and may alternatively refer to that two or more elements interact with each other. Terms such as "first", "second", and the like used in this specification are used for distinguishing mentioned elements, but are not used for ordering or limiting differences of the mentioned elements, and are not used for limiting the scope of the present disclosure.

Figure 1:
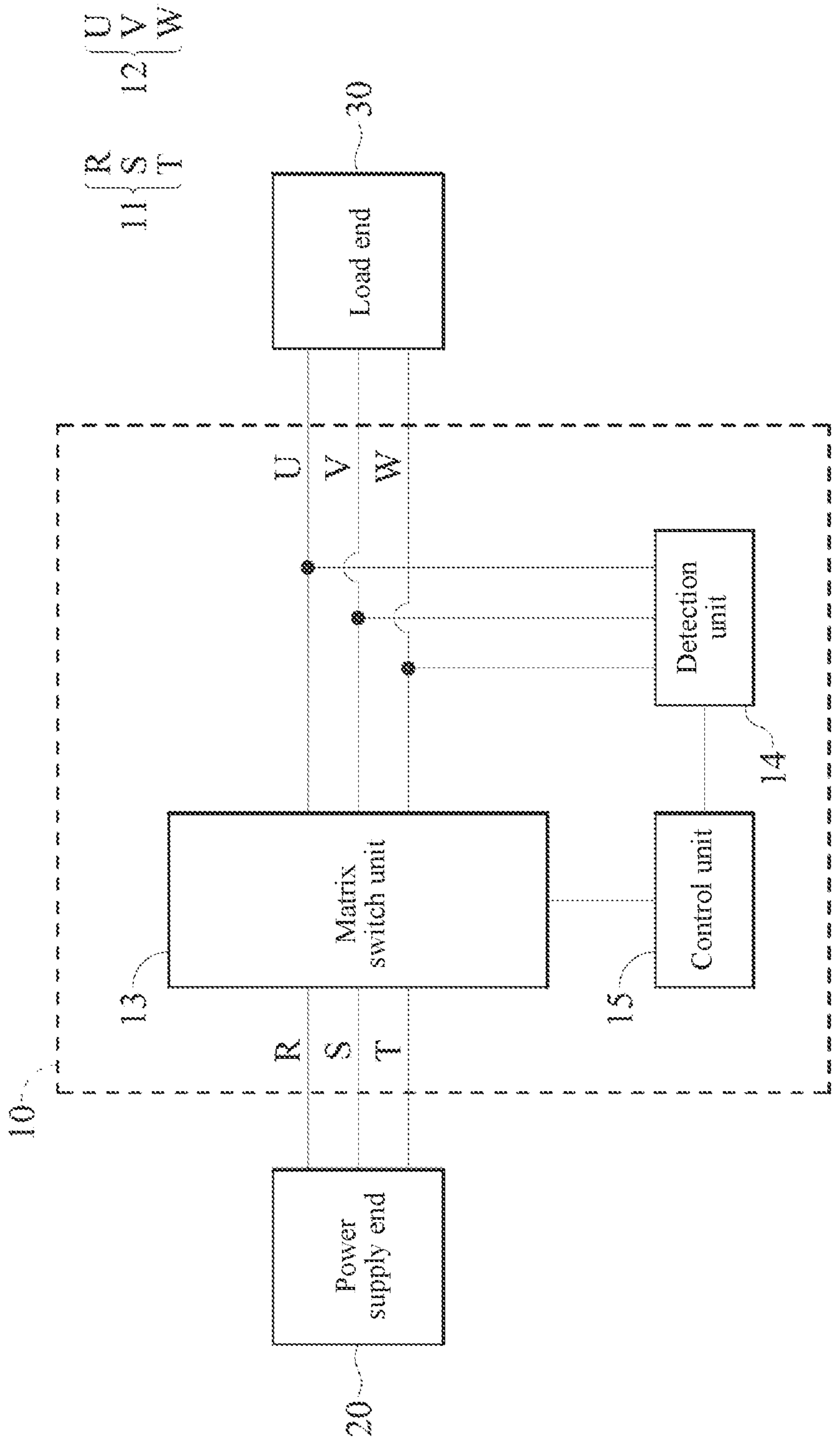
FIG. 1 is a block diagram of a phase power supply path switching circuit according to some embodiments of the present disclosure.

FIG. 1 is a block diagram of a phase power supply path switching circuit 10 according to some embodiments of the present disclosure. The phase power supply path switching circuit 10 is coupled between a power supply end 20 and a load end 30. The phase power supply path switching circuit 10 receives three phase power supplies provided by the power supply end 20, and provides the three phase power supplies to the load end 30.

The phase power supply path switching circuit 10 includes three phase input ends 11, three phase output ends 12, a matrix switch unit 13, a detection unit 14, and a control unit 15. The three phase input ends 11 include a first phase input end R, a second phase input end S, and a third phase input end T, to be coupled to the power supply end 20 and respectively receive the three phase power supplies from the power supply end 20. The three phase output ends 12 include a first phase output end U, a second phase output end V, and a third phase output end W, to be coupled to the load end 30 and respectively output the three phase power supplies to the load end 30. The first phase input end R, the second phase input end S, and the third phase input end T are respectively coupled to the first phase output end U, the second phase output end V, and the third phase output end W through the matrix switch unit 13, to respectively form a first phase line, a second phase line, and a third phase line. The first phase line is coupled between the first phase input end R and the first phase output end U; the second phase line is coupled between the second phase input end S and the second phase output end V; and the third phase line is coupled between the third phase input end T and the third phase output end W. The detection unit 14 is coupled to the first phase line, the second phase line, and the third phase line. The detection unit 14 has a voltage detection circuit to detect voltages of the first phase line, the second phase line, and the third phase line. The control unit 15 is coupled to the detection unit 14 and the matrix switch unit 13, and after receiving a switching signal, the control unit controls the matrix switch unit 13 in response to a detection result of the detection unit 14 to implement an objective of switching a phase power supply path. An operation process is described in detail in the following.

The switching a phase power supply path refers to mutual switching between two phase power supply paths. Specifically, an $X^{th}$ phase input end of an $X^{th}$ phase line is originally coupled to an $X^{th}$ phase output end, and a $Y^{th}$ phase input end of a $Y^{th}$ phase line is originally coupled to a $Y^{th}$ phase output end. After phase power supply path switching, the $X^{th}$ phase input end is coupled to the $Y^{th}$ phase output end, and the $Y^{th}$ phase input end is coupled to the $X^{th}$ phase output end. In this specification, a process of switching a phase power supply path is described by mutual switching between the first phase line and the second phase line. It may be understood that, a same operation manner may be applied to a situation of mutual switching between the second phase line and the third phase line or a situation of mutual switching between the third phase line and the first phase line, and details are not described herein again.

In some embodiments, the switching signal is generated by a person by operating a trigger switch coupled to the control unit 15 when finding a switching requirement. In some other embodiments, an electronic device executes analysis logic, and transmits a switching signal to the control unit 15 when finding and determining through the analysis logic that a switching condition is satisfied. The analysis logic may be to analyze power of three phase loads, and determine that the switching condition is satisfied when the power of the three phase loads is unbalanced. After a phase power supply path is switched, loads of two coupled phase lines are exchanged with each other, so that load balancing may be achieved.

Figure 2:
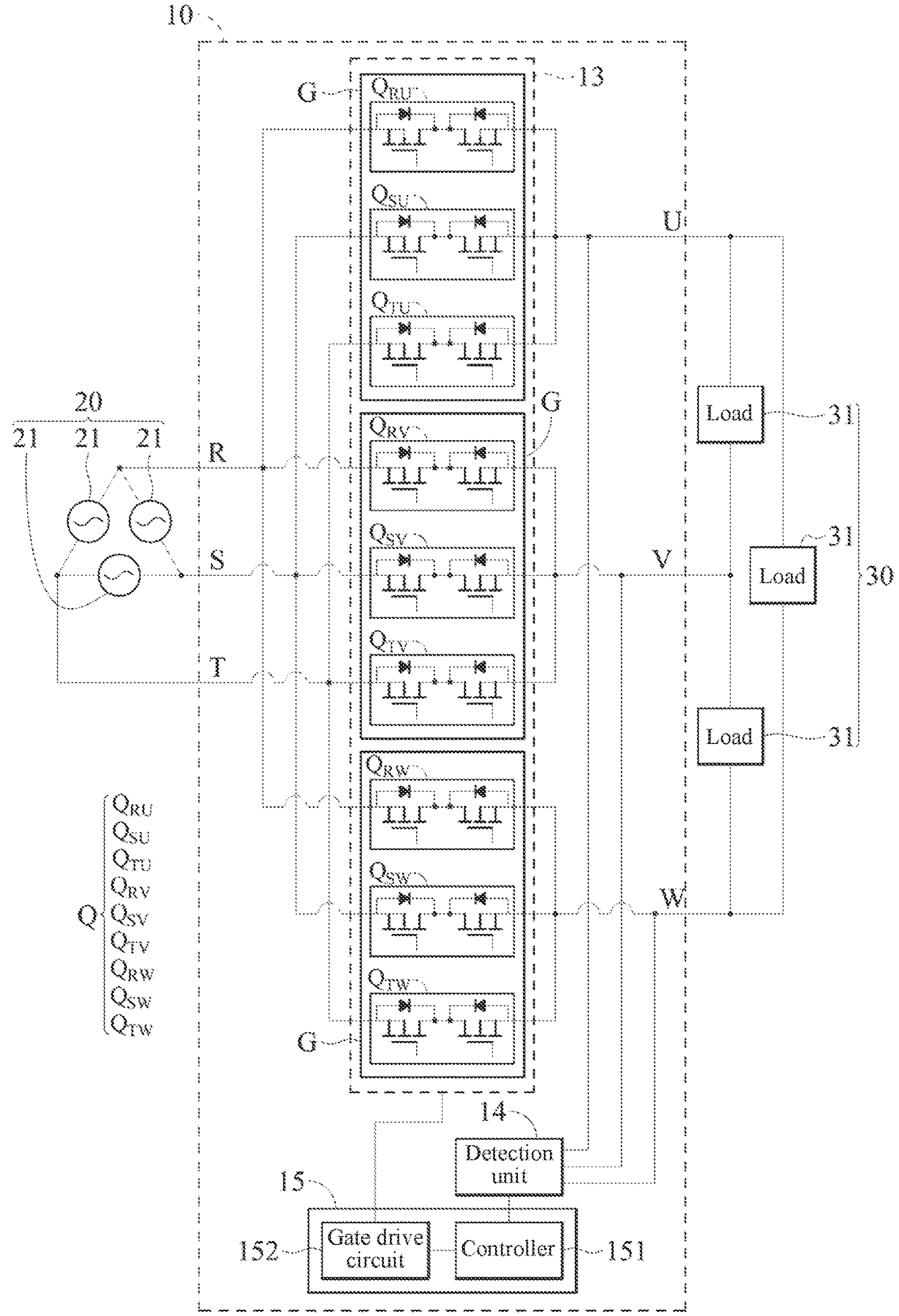
FIG. 2 is a circuit diagram of a phase power supply path switching circuit according to a first embodiment and a second embodiment of the present disclosure.

FIG. 2 is a circuit diagram of a phase power supply path switching circuit 10 according to a first embodiment and a second embodiment of the present disclosure. The matrix switch unit 13 includes a plurality of bidirectional switches Q. Each of the plurality of bidirectional switches Q is coupled between one phase input end of the three phase input ends 11 and one phase output end of the three phase output ends 12. In detail, a bidirectional switch $Q_{RU}$ is coupled between the first phase input end R and the first phase output end U; a bidirectional switch $Q_{SU}$ is coupled between the second phase input end S and the first phase output end U; a bidirectional switch $Q_{TU}$ is coupled between the third phase input end T and the first phase output end U; a bidirectional switch $Q_{RV}$ is coupled between the first phase input end R and the second phase output end V; a bidirectional switch $Q_{SV}$ is coupled between the second phase input end S and the second phase output end V; a bidirectional switch $Q_{TV}$ is coupled between the third phase input end T and the second phase output end V; a bidirectional switch $Q_{RW}$ is coupled between the first phase input end R and the third phase output end W; a bidirectional switch $Q_{SW}$ is coupled between the second phase input end S and the third phase output end W; and a bidirectional switch $Q_{TW}$ is coupled between the third phase input end T and the third phase output end W.

As shown in FIG. 2, every three bidirectional switches Q form a switch group G. The matrix switch unit 13 include three switch groups G. First ends of the bidirectional switches Q of each of the three switch groups G are respectively coupled to the three phase input ends 11 in a one-to-one manner, and second ends of the bidirectional switches Q of each of the three switch groups G are together coupled to one of the three phase output ends 12, so that the three switch groups G are respectively coupled to the three phase output ends 12 in a one-to-one manner. Before phase power supply path switching, only one bidirectional switch Q in each of the three switch groups G is bidirectionally turned on (that is, the bidirectional switches $Q_{RU}$, $Q_{SV}$, and $Q_{TW}$ are bidirectionally turned on), and the remaining bidirectional switches Q are bidirectionally turned off. In this case, the first phase input end R and the first phase output end U are conducted through the bidirectional switch $Q_{RU}$, so that a first phase power supply is supplied to the load end 30 through the first phase line (including the first phase input end R, the bidirectional switch $Q_{RU}$, and the first phase output end U); the second phase input end S and second phase output end V are conducted through the bidirectional switch $Q_{SV}$, so that a second phase power supply is supplied to the load end 30 through the second phase line (including the second phase input end S, the bidirectional switch $Q_{SV}$, and the second phase output end V); and the third phase input end T and third phase output end W are conducted through the bidirectional switch $Q_{TW}$, so that a third phase power supply is supplied to the load end 30 through the third phase line (including the third phase input end T, the bidirectional switch $Q_{TW}$, and the third phase output end W).

As shown in FIG. 2, in some embodiments, the detection unit 14 is coupled to the three phase output ends 12 to detect line voltages between phase lines. The control unit 15 receives a detection result of the detection unit 14 and determines to switch a phase power supply path at an appropriate time point.

As shown in FIG. 2, in some embodiments, three single-phase power supplies 21 included in the power supply end 20 are coupled in a delta connection (Δ connection), and three loads 31 included in the load end 30 are coupled in a delta connection (Δ connection).

Figure 3:
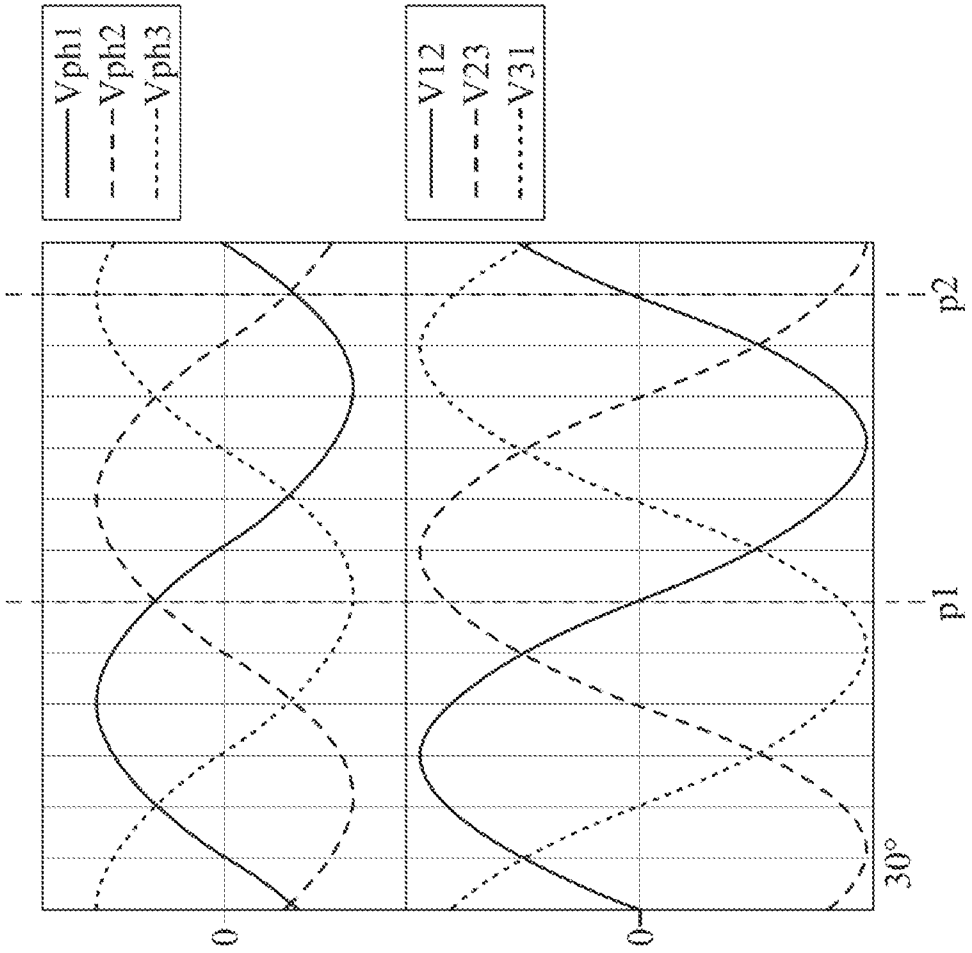
FIG. 3 is a schematic diagram of phase voltages and line voltages of three phase power supplies according to some embodiments of the present disclosure.

FIG. 3 is a schematic diagram of phase voltages and line voltages of three phase power supplies according to some embodiments of the present disclosure. An upper part of FIG. 3 shows waveforms of three phase voltages Vph1, Vph2, and Vph3 of the three phase power supplies, and phases are sequentially different from each other by 120°. The phase voltage Vph1 is a phase voltage of the first phase power supply, the phase voltage Vph2 is a phase voltage of the second phase power supply, and the phase voltage Vph3 is a phase voltage of the third phase power supply. A lower part of FIG. 3 shows three line voltages $V_{12}$, $V_{23}$, and $V_{31}$ of the three phase power supplies. The line voltage $V_{12}$ is a line voltage between the first phase line and the second phase line, that is, a difference between the phase voltage Vph1 and the phase voltage Vph2. The line voltage $V_{23}$ is a line voltage between the second phase line and the third phase line, that is, a difference between the phase voltage Vph2 and the phase voltage Vph3. The line voltage $V_{31}$ is a line voltage between the third phase line and the first phase line, that is, a difference between the phase voltage Vph3 and the phase voltage Vph1.

After receiving the switching signal, the control unit 15 does not switch the phase power supply path immediately, but waits for an appropriate time point for switching. Referring to FIG. 3, at a time point p1 and a time point p2, the phase voltage Vph1 and the phase voltage Vph2 intersect with each other (the line voltage $V_{12}$ is zero), that is, a voltage value difference between the two phase voltages is smallest. Performing phase power supply path switching at the time point p1 or the time point p2 can avoid a surge current caused during switch switching due to a relatively large voltage difference between the two phase voltages. Therefore, the control unit 15 chooses to perform phase power supply path switching at the time point p1 or the time point p2. At the time point p1, the line voltage $V_{23}$ is within a positive half cycle of a polarity half cycle; and at the time point p2, the line voltage $V_{23}$ is within a negative half cycle of the polarity half cycle.

Figure 4:
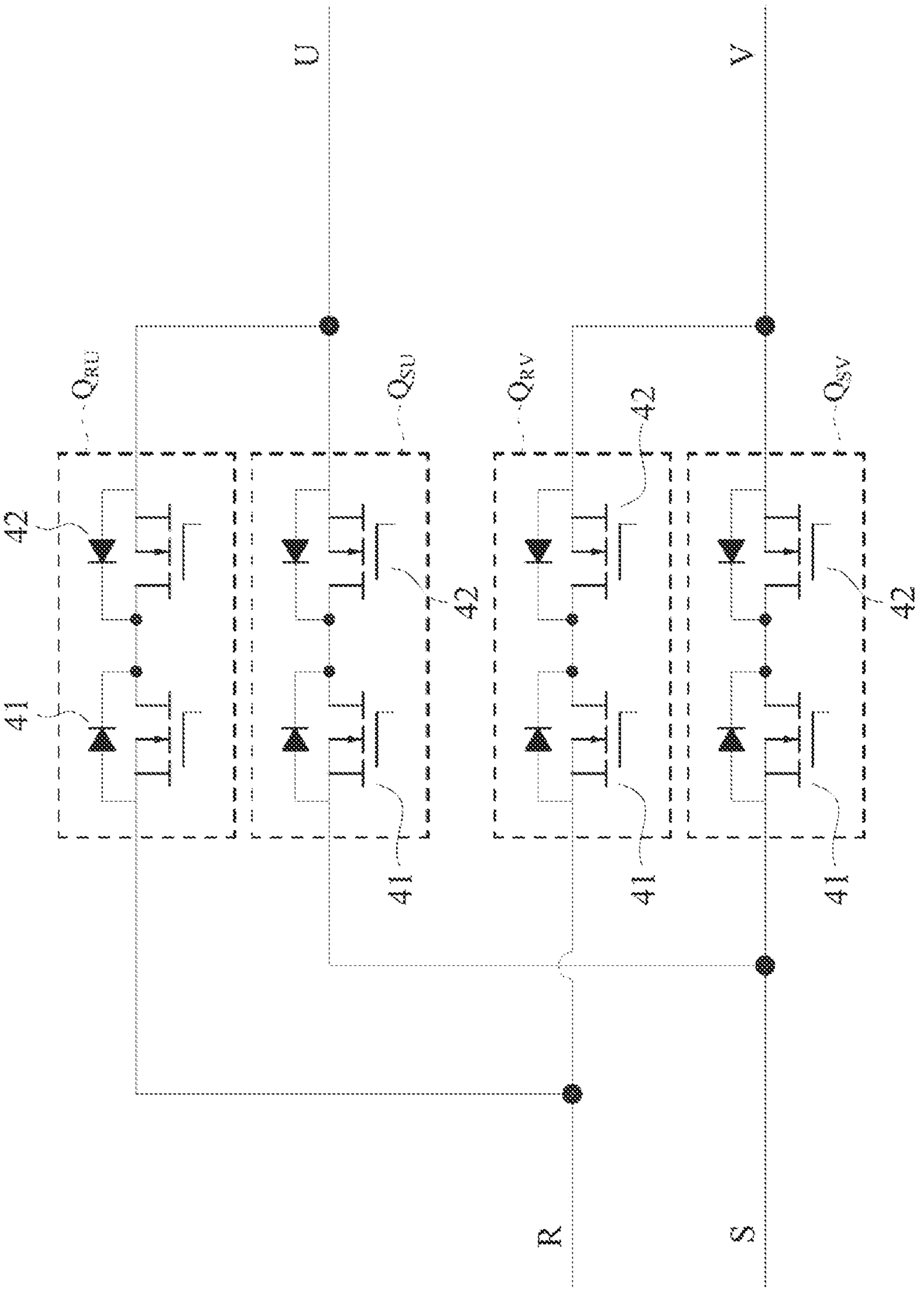
FIG. 4 is a partial schematic diagram of a matrix switch unit according to a first embodiment of the present disclosure.

Herein, the first embodiment is used for describing a situation of performing phase power supply path switching at the time point p1 (the line voltage $V_{23}$ is within the positive half cycle). Referring to FIG. 3, FIG. 4, and Table 1 together, FIG. 4 is a partial schematic diagram of a matrix switch unit 13 according to a first embodiment of the present disclosure. At the time point p1, both the phase voltage Vph1 and the phase voltage Vph2 are within the positive half cycle. In this case, a current direction flows from the first end (one end coupled to the three phase input ends 11, that is, a power supply side) of the bidirectional switch Q to the second end (one end coupled to the three phase output ends 12, that is, a load side) of the bidirectional switch Q. Each of the plurality of bidirectional switches Q includes a first switch 41 and a second switch 42 connected in series. In the first embodiment, the first switch 41 refers to a unidirectional switch (hereinafter referred to as a "power supply side switch") located at the first end (the power supply side) of the bidirectional switch Q, and the second switch 42 refers to a unidirectional switch (hereinafter referred to as a "load side switch") located at the second end (the load side) of the bidirectional switch Q.

TABLE 1

| | Positive half cycle |
|---|---|
| Current direction | From the power supply side to the load side |
| First conduction direction | From the load side to the power supply side |
| Second conduction direction | From the power supply side to the load side |

The first switch 41 is responsible for turning on or turning off the first conduction direction. The first conduction direction is opposite to a current direction of a polarity half cycle of a phase power supply coupled to the bidirectional switch Q. In the positive half cycle, the first conduction direction is from the load side to the power supply side. When the first switch 41 is in a turn-off state, the first conduction direction is turned off, that is, a current in the first conduction direction is blocked from flowing through the bidirectional switch Q. When the first switch 41 is in a turn-on state, the first conduction direction is turned on, that is, a current in the first conduction direction is allowed to flow through the bidirectional switch Q.

The second switch 42 is responsible for turning on or turning off the second conduction direction. The second conduction direction is the same as a current direction of a polarity half cycle of a phase power supply coupled to the bidirectional switch Q. In the positive half cycle, the second conduction direction is from the power supply side to the load side. When the second switch 42 is in a turn-off state, the second conduction direction is turned off, that is, a current in the second conduction direction is blocked from flowing through the bidirectional switch Q. When the second switch 42 is in a turn-on state, the second conduction direction is turned on, that is, a current in the second conduction direction is allowed to flow through the bidirectional switch Q.

As shown in FIG. 4, the bidirectional switch Q uses two power semiconductor switches connected in reverse series to implement the first switch 41 and the second switch 42. In some embodiments, the power semiconductor switch is presented as a metal-oxide-semiconductor field-effect transistor (MOSFET), but the present disclosure is not limited thereto. For example, the power semiconductor switch may alternatively be a gate isolation transistor (IGBT). Specifically, a drain of the first switch 41 is coupled to a drain of the second switch 42, that is, the first switch is in common drain (common drain) coupling to the second switch. A source of the first switch 41 is coupled to a corresponding phase input end, and a source of the second switch 42 is coupled to a corresponding phase output end. A gate of the first switch 41 and a gate of the second switch 42 are coupled to the control unit 15, so that the control unit 15 controls turn-on and turn-off states of the first switch 41 and the second switch 42.

To avoid excessively complex diagrams, the diagrams herein do not illustrate a connection relationship that the gate of the first switch 41 and the gate of the second switch 42 are coupled to the control unit 15. In addition, as shown in FIG. 2, the control unit 15 includes a controller 151 and a gate drive circuit 152. The gate drive circuit 152 receives a low power signal generated by the controller 151 to drive a gate of the power semiconductor switch to turn on or turn off the power semiconductor switch. The controller 151 is a digital controller, that is, has functions such as digital signal processing, calculation, and control, and is, for example, but not limited to: a microcontroller, a digital signal processor (digital signal processor, DSP), a field-programmable gate array (field-programmable gate array, FPGA), or an application-specific integrated circuit (application-specific integrated circuit, ASIC).

Referring to FIG. 4, when the first switch 41 is in the turn-on state, a transistor of the first switch 41 is turned on, so that the first conduction direction of the first switch 41 is turned on. When the first switch 41 is in the turn-off state, the transistor of the first switch 41 is turned off, and a body diode of the first switch 41 blocks a current in the first conduction direction, so that the first conduction direction of the first switch 41 is turned off.

When the second switch 42 is in the turn-on state, a transistor of the second switch 42 is turned on, so that the second conduction direction of the second switch 42 is turned on. When the second switch 42 is in the turn-off state, the transistor of the second switch 42 is turned off, and a body diode of the second switch 42 blocks a current in the second conduction direction, so that the second conduction direction of the second switch 42 is turned off.

Figure 5:
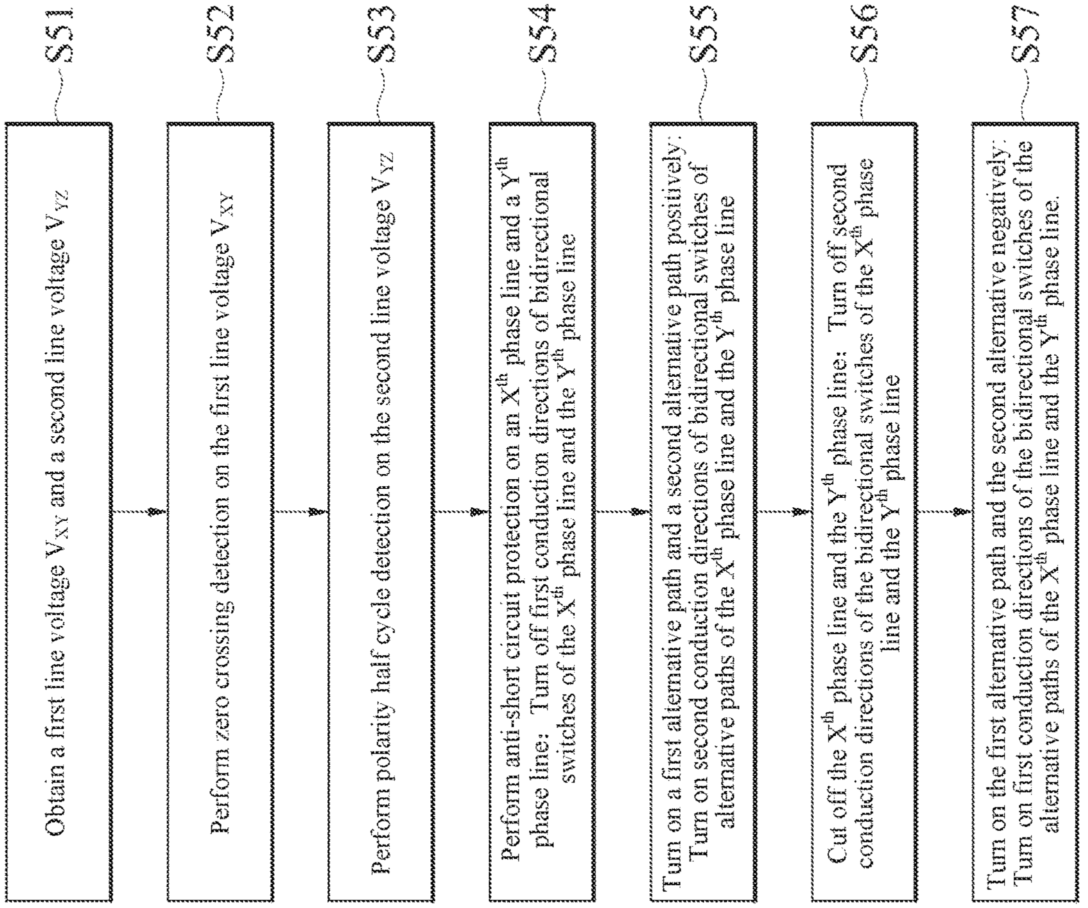
FIG. 5 is a flowchart of phase power supply path switching according to some embodiments of the present disclosure.

FIG. 5 is a flowchart of phase power supply path switching according to some embodiments of the present disclosure. After receiving the switching signal, the control unit 15 (the controller 151) performs a process shown in FIG. 5.

In step S51, the control unit 15 obtains two line voltage values (a first line voltage $V_{XY}$ and a second line voltage $V_{YZ}$) through the detection unit 14. In this case, the first line voltage $V_{XY}$ is the line voltage $V_{12}$, and the second line voltage $V_{YZ}$ is the line voltage $V_{23}$.

Step S52 is to perform zero crossing detection on the first line voltage $V_{XY}$. That is, the control unit 15 determines whether the first line voltage $V_{XY}$ is zero; if yes, performs step S53; or if no, continues to wait in step S52 for the first line voltage $V_{XY}$ to be zero.

Step S53 is to perform polarity half cycle detection on the second line voltage $V_{YZ}$. That is, the control unit 15 determines a polarity half cycle in which the second line voltage $V_{YZ}$ is within. In the first embodiment, the control unit 15 determines that the second line voltage $V_{YZ}$ is within the positive half cycle.

Figure 6:
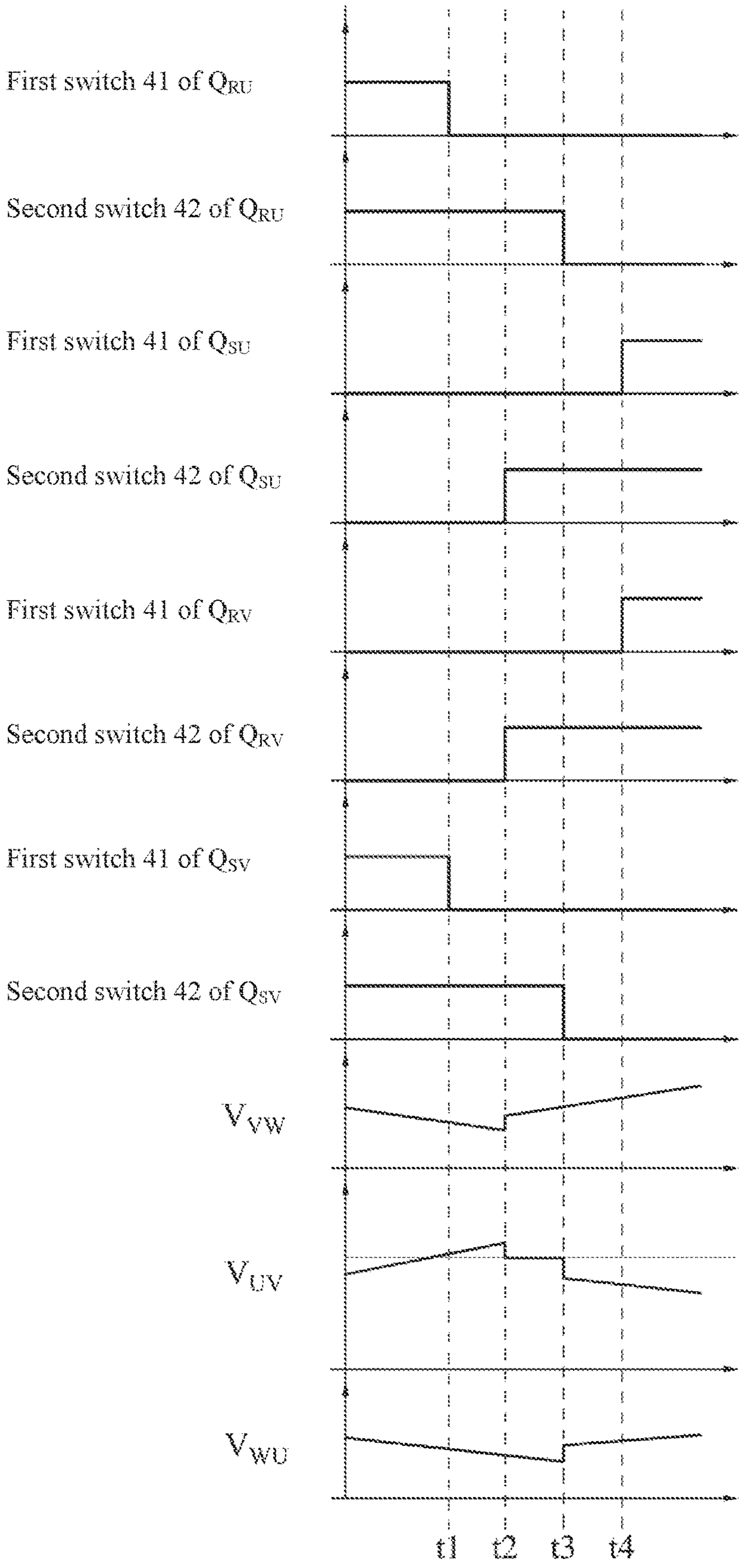
FIG. 6 is a timing diagram of a phase power supply path switching process according to a first embodiment of the present disclosure.

After step S52 and step S53, the foregoing time point p1 is found. That is, the control unit 15 detects that the first line voltage $V_{XY}$ is zero and the second line voltage $V_{YZ}$ is within the positive half cycle of the polarity half cycle. A process of phase power supply path switching of the first embodiment is described below with reference to FIG. 5 to FIG. 10. FIG. 6 is a timing diagram of a phase power supply path switching process according to a first embodiment of the present disclosure. FIG. 7 to FIG. 10 are partial schematic diagrams 1 to 4 of a circuit state of a matrix switch unit 13 according to a first embodiment of the present disclosure. In response to detecting the time point p1 (that is, time t1 in FIG. 6, in this case, the line voltage $V_{12}$ is zero and the line voltage $V_{23}$ is within the positive half cycle), the control unit 15 then performs step S54 to step S57.

Figure 7:
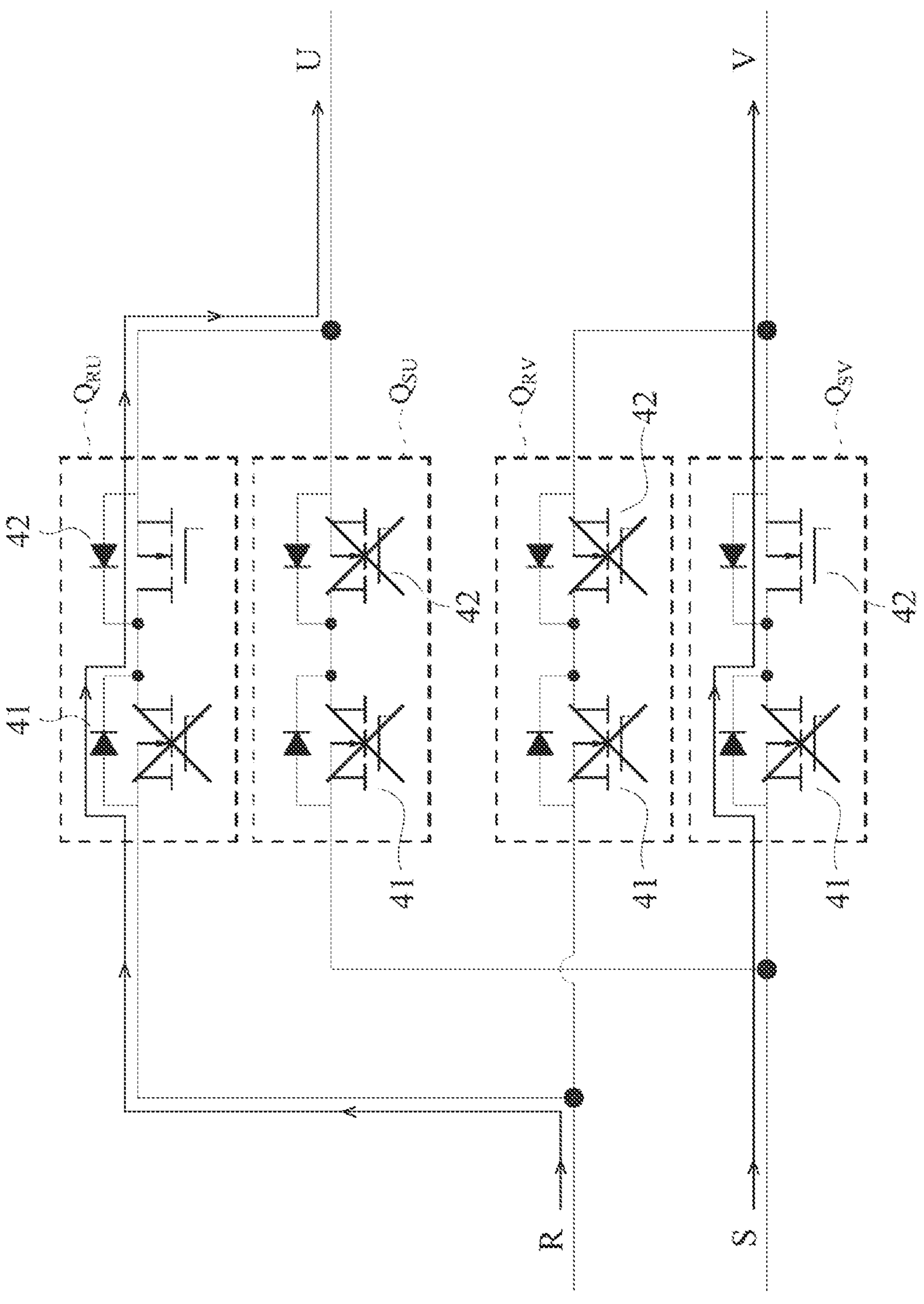
FIG. 7 is a partial schematic diagram 1 of a circuit state of a matrix switch unit according to a first embodiment of the present disclosure.

Step S54 is to perform anti-short circuit protection on an $X^{th}$, phase line and a $Y^{th}$, phase line. Specifically, the control unit 15 turns off first conduction directions of bidirectional switches Q of the $X^{th}$ phase line and the $Y^{th}$ phase line. Referring to FIG. 6 and FIG. 7, in this case, the $X^{th}$ phase line is the first phase line, and the $Y^{th}$ phase line is the second phase line. At the time t1, the control unit 15 turns off the first conduction directions of the bidirectional switches $Q_{RU}$ and $Q_{SV}$. That is, the first switches 41 in the bidirectional switches $Q_{RU}$ and $Q_{SV}$ are turned off. Although the first switches 41 in the bidirectional switches $Q_{RU}$ and $Q_{SV}$ are turned off, since the first phase power supply and the second phase power supply are within the positive half cycle, body diodes in the bidirectional switches $Q_{RU}$ and $Q_{SV}$ are still turned on due to a forward bias voltage, and the first phase power supply and the second phase power supply are still transmitted to the load end 30 through the first phase line and the second phase line. By using a reverse turn-off characteristic of the body diodes of the first switches 41 in the bidirectional switches $Q_{RU}$ and $Q_{SV}$, when an alternative path is turned on in subsequent steps, no reverse current passes through the first phase line and the second phase line, and a short circuit of the power supply end 20 is prevented.

Figure 8:
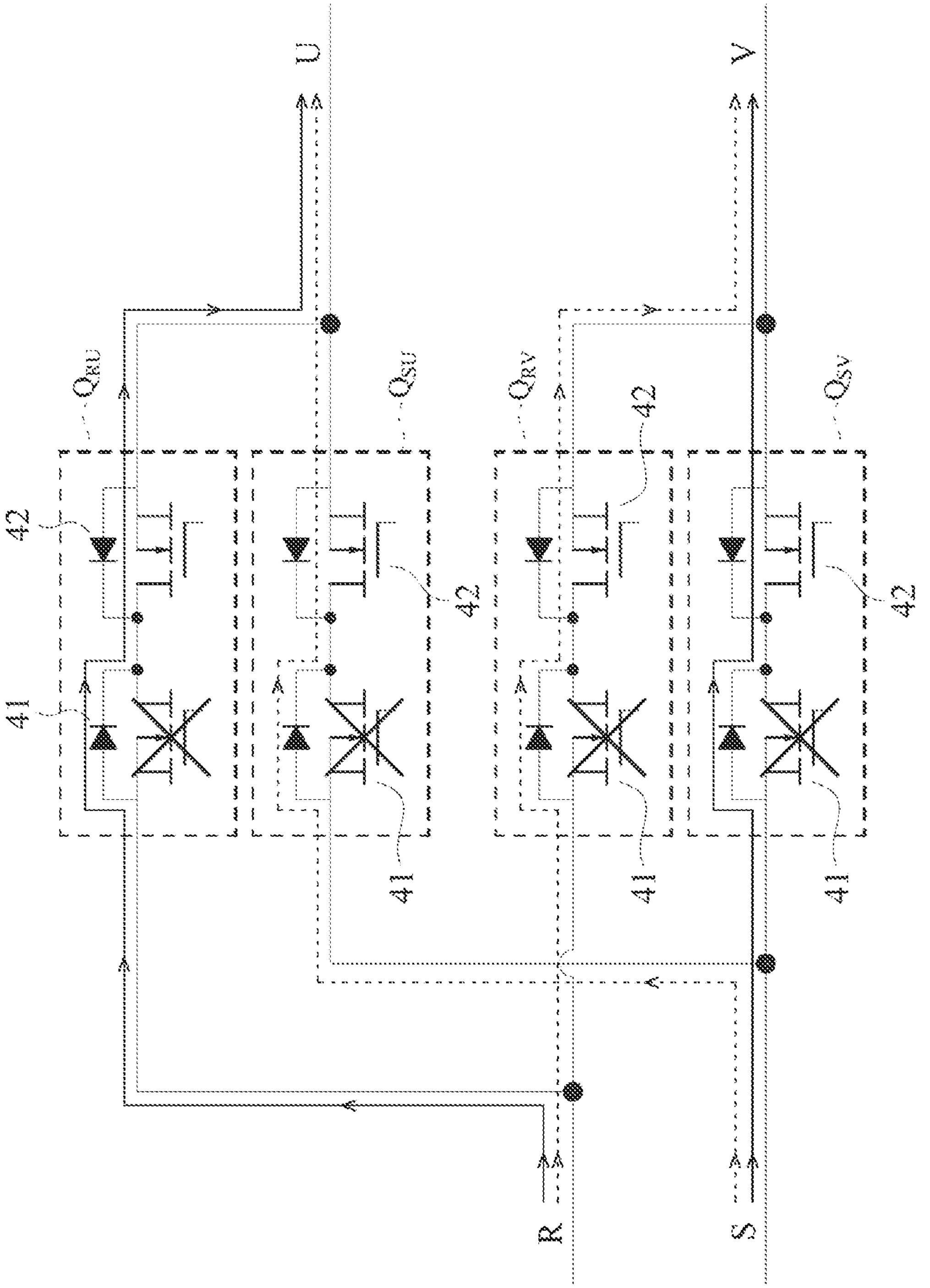
FIG. 8 is a partial schematic diagram 2 of a circuit state of a matrix switch unit according to a first embodiment of the present disclosure.

Step S55 is to positively turn on a first alternative path and a second alternative path. Specifically, the control unit 15 turns on second conduction directions of bidirectional switches Q of alternative paths of the $X^{th}$ phase line and the $Y^{th}$ phase line. The alternative path of the $X^{th}$ phase line is from an $X^{th}$ phase input end to a $Y^{th}$ phase output end; and the alternative path of the $Y^{th}$ phase line is from a $Y^{th}$ phase input end to an $X^{th}$ phase output end. Referring to FIG. 6 and FIG. 8, in this case, the $X^{th}$ phase line is the first phase line, and the $Y^{th}$ phase line is the second phase line. A first alternative path is from the first phase input end R to the second phase output end V; and a second alternative path is from the second phase input end S to the first phase output end U. At time t2, the control unit 15 turns on second conduction directions of the bidirectional switches $Q_{RV}$ and $Q_{SU}$. That is, the second switches 42 in the bidirectional switches $Q_{RV}$ and $Q_{SU}$ are turned on. At the time t2, a voltage $V_{UV}$ is positive, that is, a voltage of the first phase input end R is greater than a voltage of the second phase input end S. When the second switches 42 in the bidirectional switches $Q_{RV}$ and $Q_{SU}$ are turned on, since the voltage of the first phase input end R is greater than the voltage of the second phase input end S, the second phase output end V receives power from the first phase input end R instead, so that the voltage $V_{UV}$ is zero, and the voltage $V_{UV}$ enters power supply hold-up time (Hold-up time). In addition, as shown in FIG. 2, the load end 30 is a Δ connection. According to Kirchhoff's voltage law (Kirchhoffs voltage law, KVL), a falling part of the voltage $V_{UV}$ is supplemented by a voltage $V_{VW}$, and the voltage $V_{VW}$ increases from a voltage $V_{ST}$ to a sum of the voltage $V_{ST}$ and a voltage $V_{RS}$.

Figure 9:
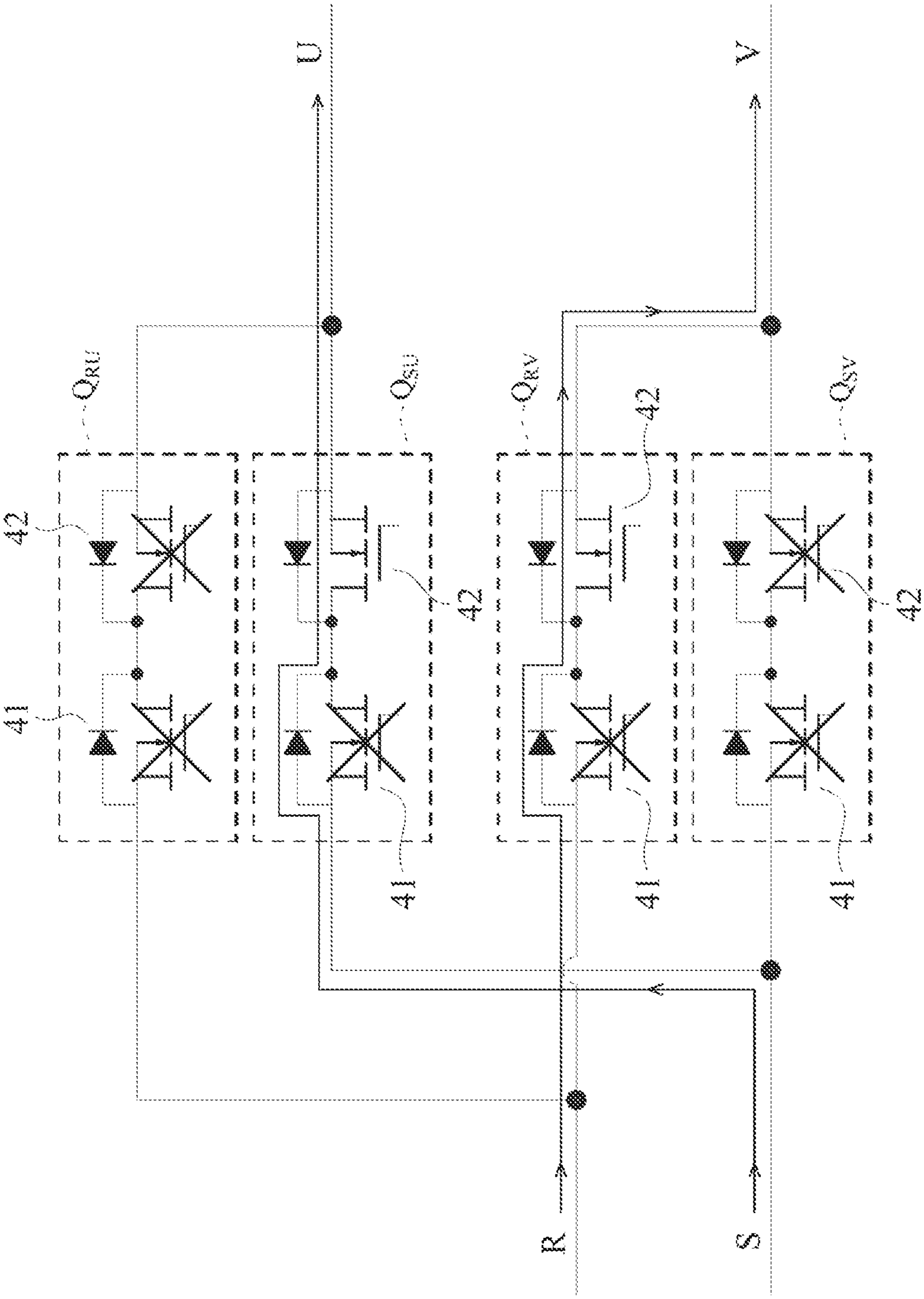
FIG. 9 is a partial schematic diagram 3 of a circuit state of a matrix switch unit according to a first embodiment of the present disclosure.

Step S56 is to cut off the $X^{th}$ phase line and the $Y^{th}$ phase line. Specifically, the control unit 15 turns off second conduction directions of bidirectional switches Q of the $X^{th}$ phase line and the $Y^{th}$ phase line. Referring to FIG. 6 and FIG. 9, in this case, the $X^{th}$ phase line is the first phase line, and the $Y^{th}$ phase line is the second phase line. At time t3, the control unit 15 turns off the second conduction directions of the bidirectional switches $Q_{RU}$ and $Q_{SV}$. That is, the second switches 42 in the bidirectional switches $Q_{RU}$ and $Q_{SV}$ are turned off. In this case, both the first switches 41 and the second switches 42 of the bidirectional switches $Q_{RU}$ and $Q_{SV}$ are turned off, so that the bidirectional switches $Q_{RU}$ and $Q_{SV}$ are bidirectionally turned off. Therefore, no phase power supply is transmitted to the load end 30 through the first phase line and the second phase line. A first phase power supply of the first phase input end R is cut off from the first phase output end U, and the first phase output end U receives a second phase power supply of the second phase input end S instead. Therefore, the voltage $V_{UV}$ is —$V_{RS}$, and the voltage $V_{UV}$ leaves the power supply hold-up time. In addition, referring to FIG. 2 and FIG. 9, according to the Kirchhoff's voltage law, the falling part of the voltage $V_{UV}$ is supplemented by a voltage $V_{WU}$, and the voltage $V_{WU}$ increases from a voltage $V_{TR}$ to a sum of the voltage $V_{TR}$ and the voltage $V_{RS}$.

Figure 10:
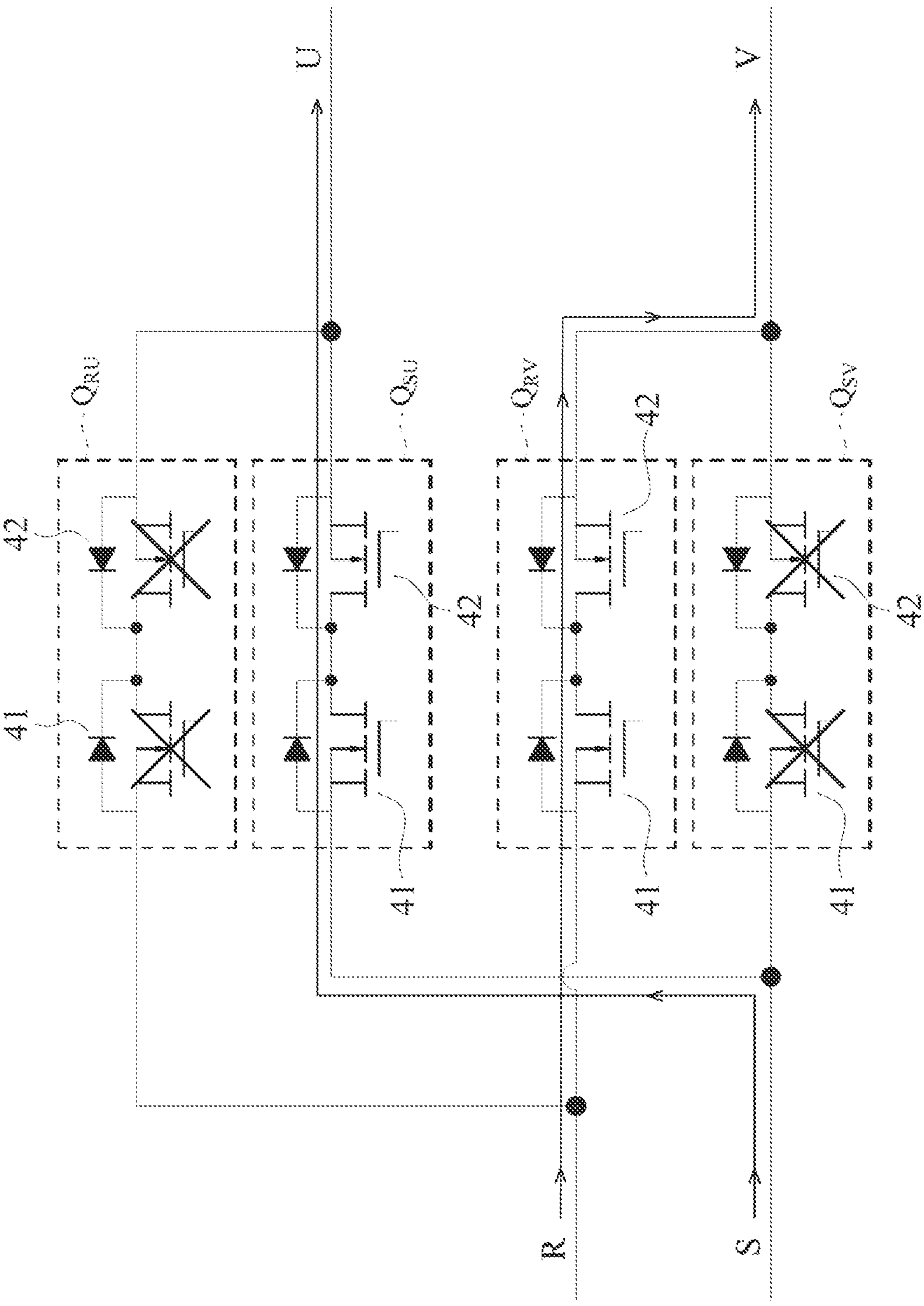
FIG. 10 is a partial schematic diagram 4 of a circuit state of a matrix switch unit according to a first embodiment of the present disclosure.

Step S57 is to negatively turn on the first alternative path and the second alternative. Specifically, the control unit 15 turns on first conduction directions of the bidirectional switches Q of the alternative paths of the $X^{th}$ phase line and the $Y^{th}$ phase line. The alternative path of the $X^{th}$ phase line is from an $X^{th}$ phase input end to a $Y^{th}$ phase output end; and the alternative path of the $Y^{th}$ phase line is from a $Y^{th}$ phase input end to an $X^{th}$ phase output end. Referring to FIG. 6 and FIG. 10, in this case, the $X^{th}$ phase line is the first phase line, and the $Y^{th}$ phase line is the second phase line. A first alternative path is from the first phase input end R to the second phase output end V; and a second alternative path is from the second phase input end S to the first phase output end U. At time t4, the control unit 15 turns on the first conduction directions of the bidirectional switches $Q_{RV}$ and $Q_{SU}$ to cancel the short-circuit protection on the two alternative paths. That is, the first switches 41 in the bidirectional switches $Q_{RV}$ and $Q_{SU}$ are turned on. In this case, both the first switches 41 and the second switches 42 of the bidirectional switches $Q_{RV}$ and $Q_{SU}$ are turned on, so that the bidirectional switches $Q_{RV}$ and $Q_{SU}$ are bidirectionally turned on. In this way, the first phase power supply and the second phase power supply are supplied to the load end 30 through the first alternative path and the second alternative path respectively, to complete phase power supply path switching.

For ease of understanding, in the first embodiment, turn-on and turn-off actions in the foregoing step S54 to step S57 are summarized in Table 2. Through the foregoing step S54 to step S57, a short circuit of the power supply end 20 is avoided during path switching, and current freewheeling is maintained during path switching, thereby increasing a power supply hold-up time capability and preventing open circuit of the load end 30. In addition, use of the bidirectional switches achieves effects such as fast switching and zero current switching (zero current switching, ZCS). After phase power supply path switching is finally completed, load balancing (or referred to as power supply power balancing) is implemented.

TABLE 2

| Step | Switch | Action |
|---|---|---|
| S54 | Power supply side switch of bidirectional switch $Q_{RU}$ (First switch 41) | Turn off |
| | Power supply side switch of bidirectional switch $Q_{SV}$ (First switch 41) | Turn off |
| S55 | Load side switch of bidirectional switch $Q_{RV}$ (Second switch 42) | Turn on |
| | Load side switch of bidirectional switch $Q_{SU}$ (Second switch 42) | Turn on |
| S56 | Load side switch of bidirectional switch $Q_{RU}$ (Second switch 42) | Turn off |
| | Load side switch of bidirectional switch $Q_{SV}$ (Second switch 42) | Turn off |
| S57 | Power supply side switch of bidirectional switch $Q_{RV}$ (First switch 41) | Turn on |
| | Power supply side switch of bidirectional switch $Q_{SU}$ (First switch 41) | Turn on |

Figure 11:
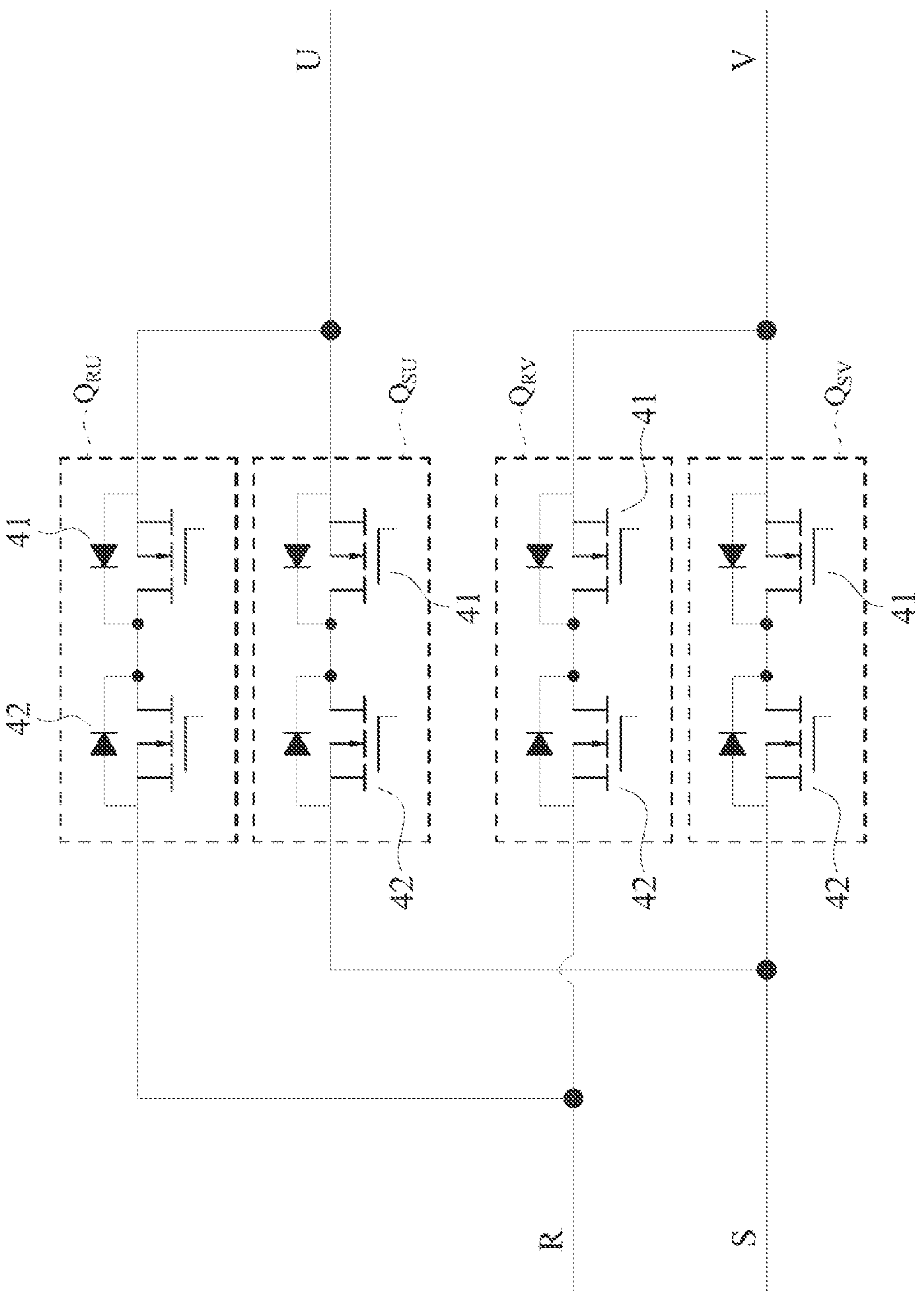
FIG. 11 is a partial schematic diagram of a matrix switch unit according to a second embodiment of the present disclosure.

A second embodiment of the present disclosure is described below. The phase power supply path switching circuit 10 of the second embodiment is as described in the first embodiment (refer to the related description of FIG. 2), and details are not described herein again. A difference from the first embodiment is that in the second embodiment, phase power supply path switching is performed at the time point p2 (the line voltage $V_{23}$ is within the negative half cycle). That is, through step S52 and step S53, the control unit 15 of the second embodiment detects that the first line voltage $V_{XY}$ is zero and the second line voltage $V_{YZ}$ is within the negative half cycle of the polarity half cycle, and performs step S54 to step S57. Referring to FIG. 3, FIG. 11, and Table 3 together, FIG. 11 is a partial schematic diagram of a matrix switch unit according to a second embodiment of the present disclosure. At the time point p2, both the phase voltage Vph1 and the phase voltage Vph2 are within the negative half cycle. In this case, a current direction flows from the second end of the bidirectional switch Q (one end coupled to the three phase output ends 12, that is, a load side) to the first end of the bidirectional switch Q (one end coupled to the three phase input ends 11, that is, a power supply side). The same as the first embodiment is that, in the second embodiment, the first switch 41 is also responsible for turning on or turning off the first conduction direction (which is opposite to a current direction of a polarity half cycle of a phase power supply coupled to the bidirectional switch Q), and the second switch 42 is also responsible for turning on or turning off the second conduction direction (which is the same as the current direction of the polarity half cycle of the phase power supply coupled to the bidirectional switch Q). In the negative half cycle, the first conduction direction is from the power supply side to the load side, and the second conduction direction is from the load side to the power supply side. Since the first conduction direction and the second conduction direction of the second embodiment are opposite to the first conduction direction and the second conduction direction of the first embodiment, in the second embodiment, the first switch 41 refers to a unidirectional switch located at the second end (the load side) of the bidirectional switch Q, and the second switch 42 refers to a unidirectional switch located at the first end (the power supply side) of the bidirectional switch Q. That is, the source of the first switch 41 is coupled to a corresponding phase output end, and the source of the second switch 42 is coupled to a corresponding phase input end. In the second embodiment, action timing of the first switches 41 and the second switches 42 of the bidirectional switches $Q_{RU}$, $Q_{SU}$, $Q_{RV}$, and $Q_{SV}$ is the same as the related description in FIG.

6, turn-on and turn-off actions are summarized in Table 4, and details are not described herein again.

TABLE 3

| | Negative half cycle |
|---|---|
| Current direction | From the load side to the power supply side |
| First conduction direction | From the power supply side to the load side |
| Second conduction direction | From the load side to the power supply side |

TABLE 4

| Step | Switch | Action |
|---|---|---|
| S54 | Load side switch of bidirectional switch $Q_{RU}$ (First switch 41) | Turn off |
| | Load side switch of bidirectional switch $Q_{SV}$ (First switch 41) | Turn off |
| S55 | Power supply side switch of bidirectional switch $Q_{RV}$ (Second switch 42) | Turn on |
| | Power supply side switch of bidirectional switch $Q_{SU}$ (Second switch 42) | Turn on |
| S56 | Power supply side switch of bidirectional switch $Q_{RU}$ (Second switch 42) | Turn off |
| | Power supply side switch of bidirectional switch $Q_{SV}$ (Second switch 42) | Turn off |
| S57 | Load side switch of bidirectional switch $Q_{RV}$ (First switch 41) | Turn on |
| | Load side switch of bidirectional switch $Q_{SU}$ (First switch 41) | Turn on |

Figure 12:
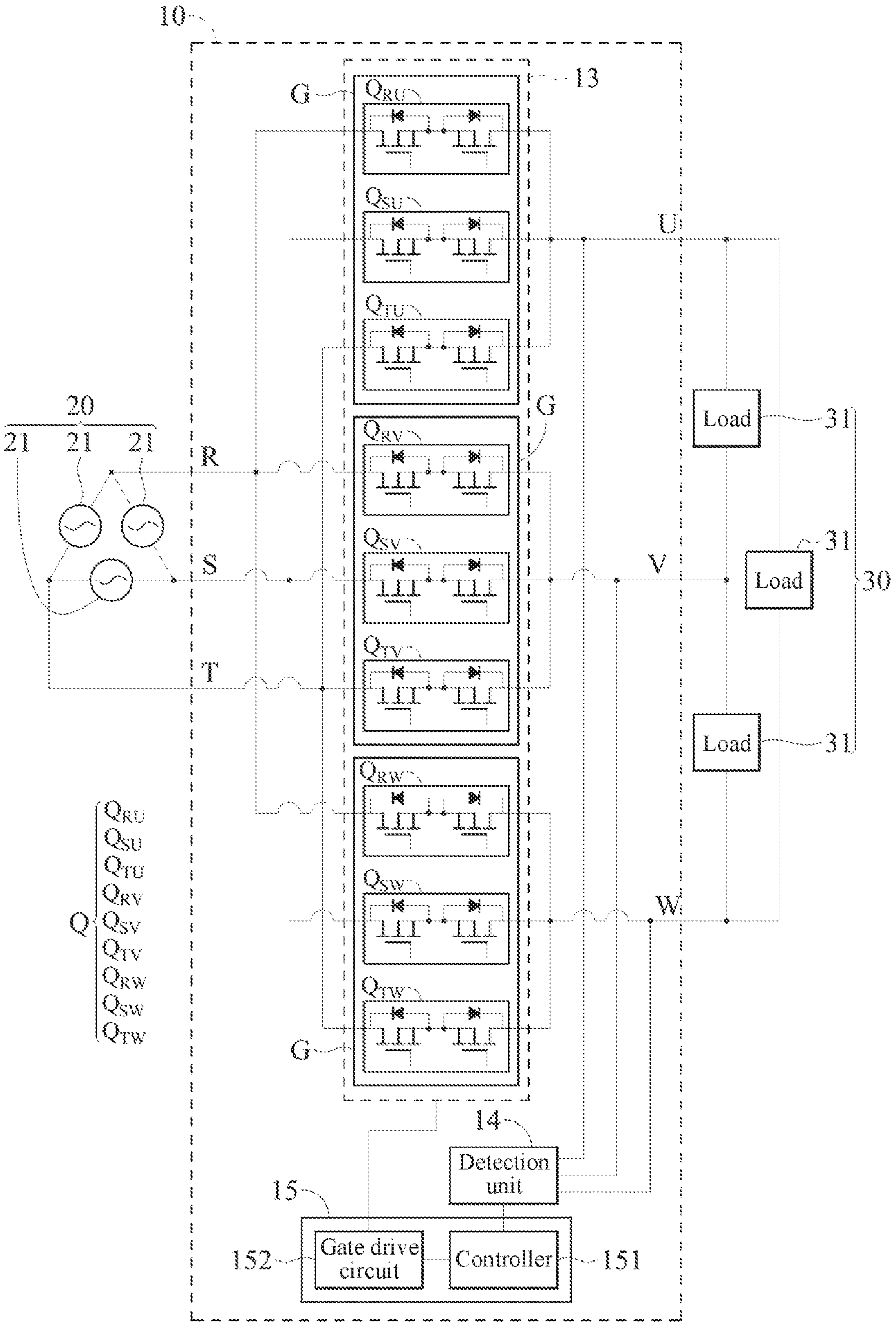
FIG. 12 is a circuit diagram of a phase power supply path switching circuit according to a third embodiment and a fourth embodiment of the present disclosure.
Figure 13:
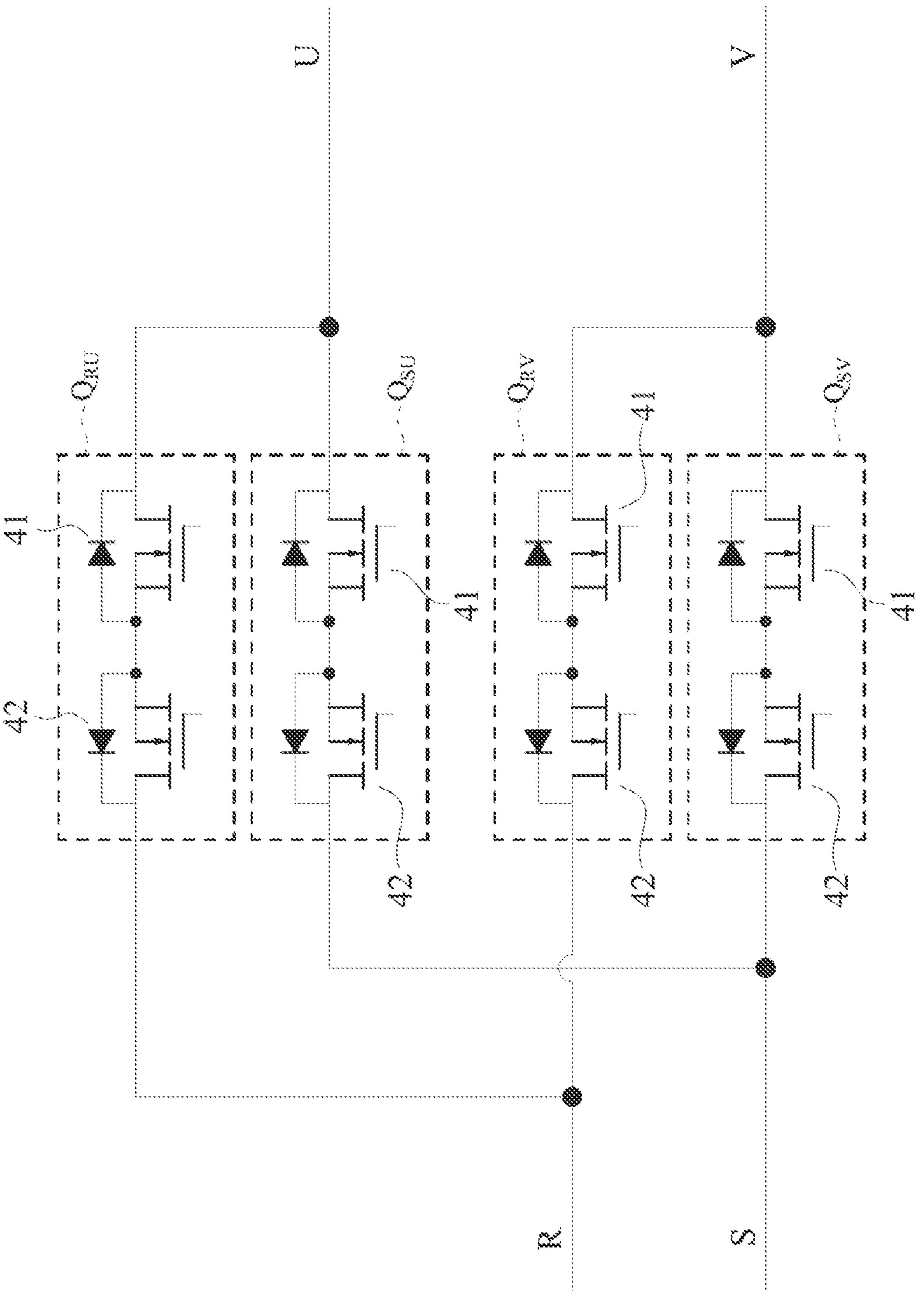
FIG. 13 is a partial schematic diagram of a matrix switch unit according to a third embodiment of the present disclosure.

A third embodiment of the present disclosure is described below. The third embodiment describes a situation of performing phase power supply path switching at the time point p1 (the line voltage $V_{23}$ is within the positive half cycle). Referring to FIG. 12 and FIG. 13 together, FIG. 12 is a circuit diagram of a phase power supply path switching circuit 10 according to a third embodiment and a fourth embodiment of the present disclosure. FIG. 13 is a partial schematic diagram of a matrix switch unit according to a third embodiment of the present disclosure. The phase power supply path switching circuit 10 of the third embodiment is substantially the same as the phase power supply path switching circuit 10 of the first embodiment. A difference is that, in the bidirectional switch Q of the third embodiment, the first switch 41 is in common source (common source) coupling to the second switch 42, that is, the source of the first switch 41 is coupled to the source of the second switch 42. In the third embodiment, the first switch 41 refers to a unidirectional switch located at the second end (the load side) of the bidirectional switch Q, and the second switch 42 refers to a unidirectional switch located at the first end (the power supply side) of the bidirectional switch Q. That is, the drain of the first switch 41 is coupled to a corresponding phase output end, and the drain of the second switch 42 is coupled to a corresponding phase input end. Compared with the first embodiment, the first switch 41 and the second switch 42 of the third embodiment are only different in position, and functions of the first switch 41 and the second switch 42 of the third embodiment are still the same as those of the first embodiment respectively. Therefore, action timing of the first switches 41 and the second switches 42 of the bidirectional switches $Q_{RU}$, $Q_{SU}$, $Q_{RV}$, and $Q_{SV}$ is the same as the related description in FIG. 6, switch actions are the same as those in Table 4, and details are not described herein again.

Figure 14:
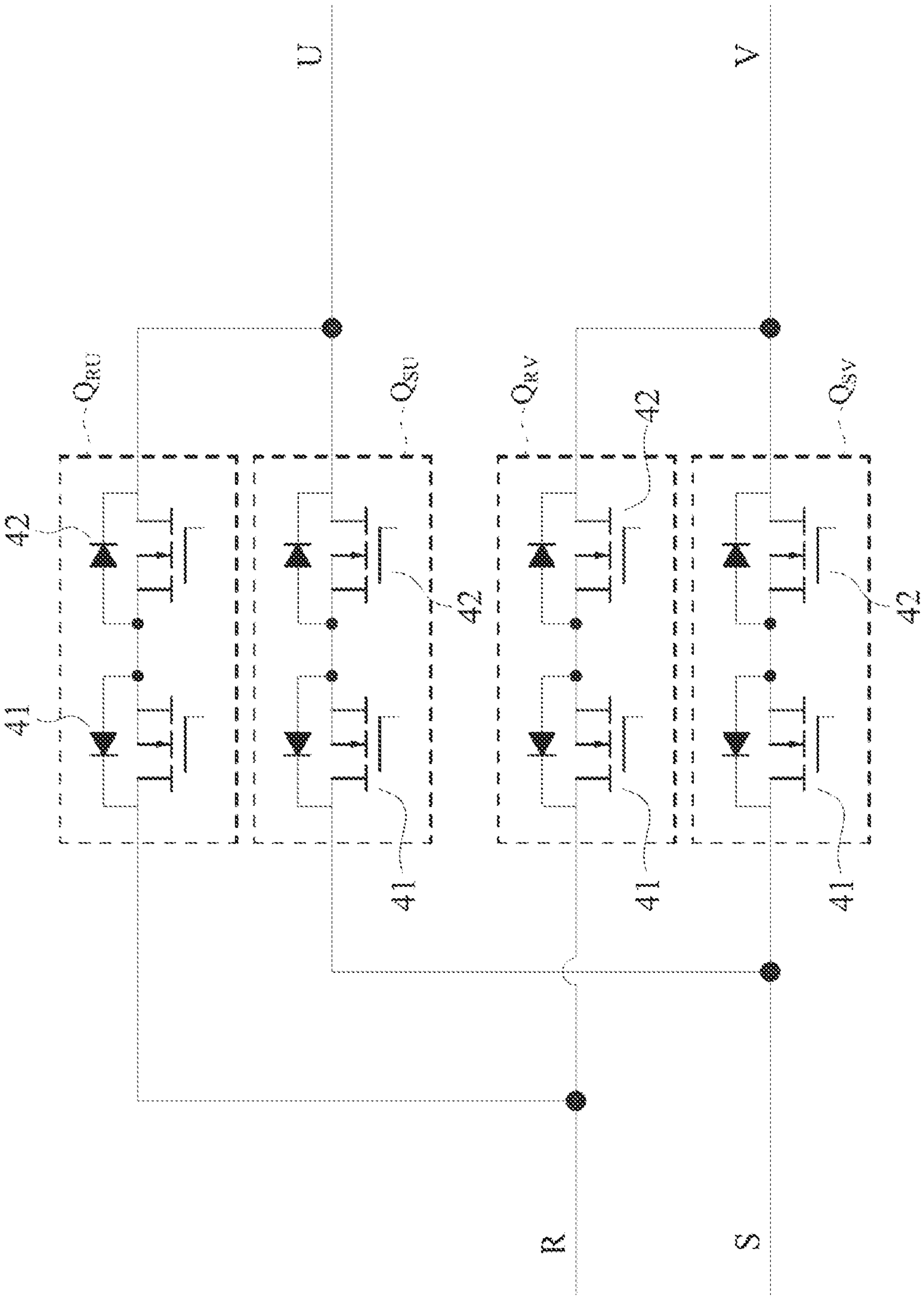
FIG. 14 is a partial schematic diagram of a matrix switch unit according to a fourth embodiment of the present disclosure.

A fourth embodiment of the present disclosure is described below. The fourth embodiment describes a situation of performing phase power supply path switching at the time point p2 (the line voltage $V_{23}$ is within the negative half cycle). Referring to FIG. 12 and FIG. 14 together, FIG. 14 is a partial schematic diagram of a matrix switch unit according to a fourth embodiment of the present disclosure. In the fourth embodiment, the first switch 41 refers to a unidirectional switch located at the first end (the power supply side) of the bidirectional switch Q, and the second switch 42 refers to a unidirectional switch located at the second end (the load side) of the bidirectional switch Q. That is, the drain of the first switch 41 is coupled to a corresponding phase input end, and the drain of the second switch 42 is coupled to a corresponding phase output end. Compared with the second embodiment, the first switch 41 and the second switch 42 of the fourth embodiment are only different in position, and functions of the first switch 41 and the second switch 42 of the fourth embodiment are still the same as those of the second embodiment respectively. Therefore, action timing of the first switches 41 and the second switches 42 of the bidirectional switches $Q_{RU}$, $Q_{SU}$, $Q_{RV}$, and $Q_{SV}$ is the same as the related description in FIG. 6, switch actions are the same as those in Table 2, and details are not described herein again.

Figure 15:
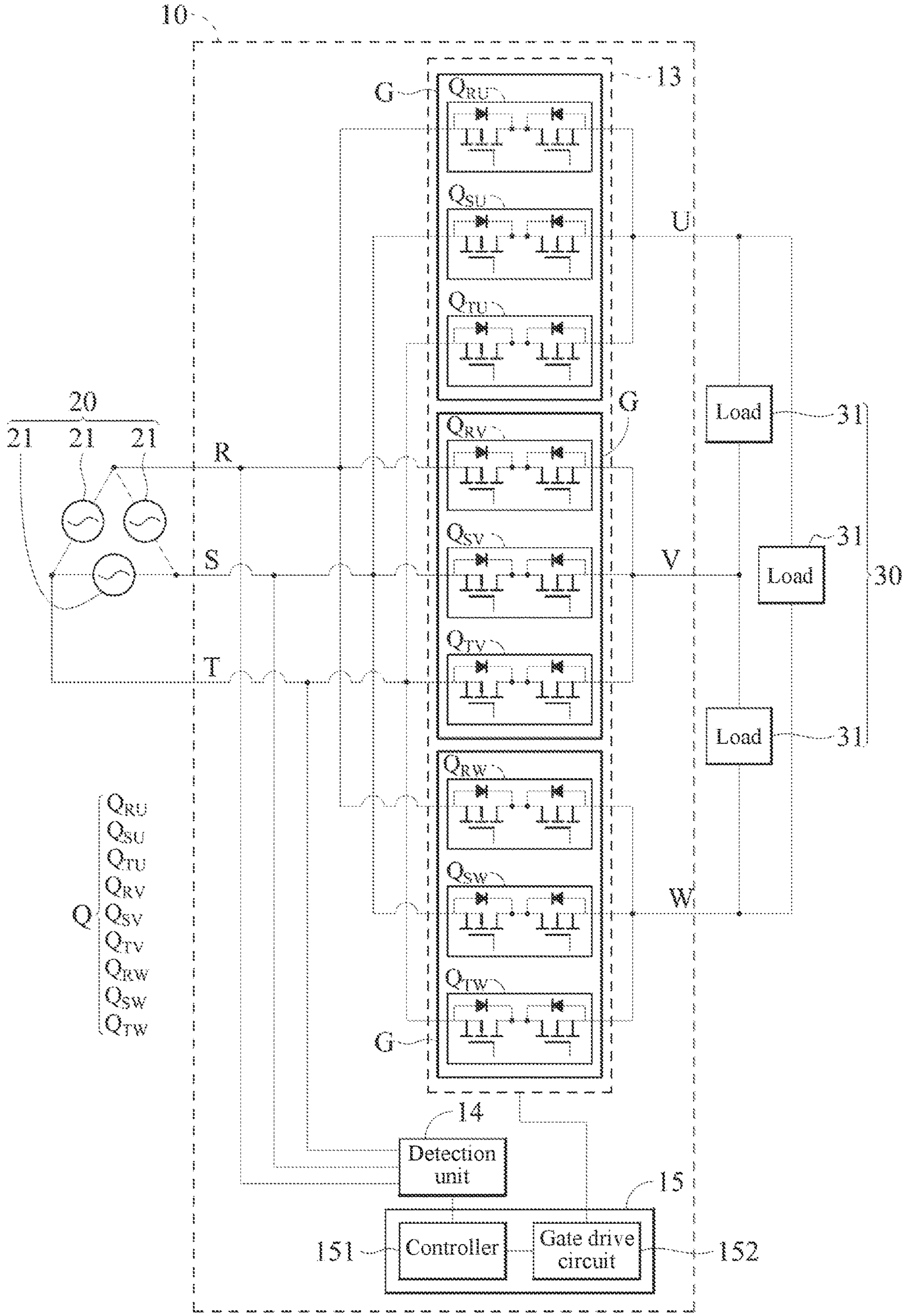
FIG. 15 is a circuit diagram of a phase power supply path switching circuit according to a fifth embodiment of the present disclosure.

FIG. 15 is a circuit diagram of a phase power supply path switching circuit 10 according to a fifth embodiment of the present disclosure. Compared with the first embodiment, the fifth embodiment is mainly an example. In some embodiments, the detection unit 14 is coupled to the three phase input ends 11 to detect line voltages between phase lines. Before phase power supply path switching is performed (that is, before the time t1 in FIG. 6), the bidirectional switches $Q_{RU}$, $Q_{SV}$, and $Q_{TW}$ are turned on bidirectionally, that is, the phase input ends are connected to corresponding phase output ends. Therefore, the detection unit 14 can achieve the same effect by being coupled to the three phase input ends 11 and coupled to the three phase output ends 12. Therefore, the fifth embodiment to an eighth embodiment of the present disclosure are similar to the foregoing first embodiment to the fourth embodiment respectively. A difference is that the detection unit 14 of the fifth embodiment to the eighth embodiment is coupled to the three phase input ends 11. In this case, the foregoing step S51 to step S57 may also be performed to complete phase power supply path switching.

Figure 16:
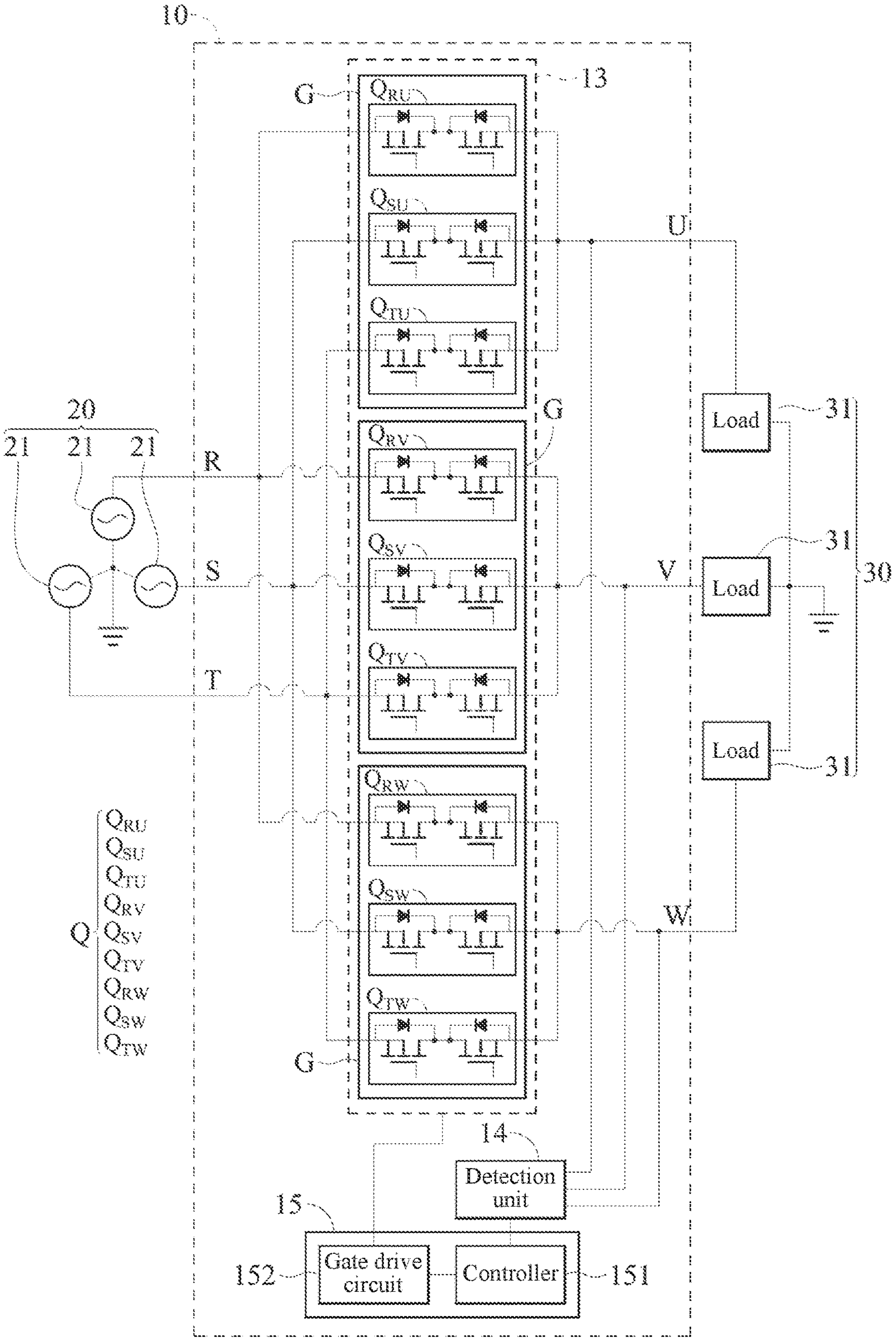
FIG. 16 is a circuit diagram of a phase power supply path switching circuit according to a ninth embodiment of the present disclosure.

FIG. 16 is a circuit diagram of a phase power supply path switching circuit 10 according to a ninth embodiment of the present disclosure. The ninth embodiment is mainly an example. In some embodiments, the three single-phase power supplies 21 included in the power supply end 20 are coupled in a star connection (Y connection), and the three loads 31 included in the load end 30 are coupled in a star connection (Y connection). Since the line voltages $V_{12}$, $V_{23}$, and $V_{31}$ are detected in the present disclosure, manners in which the power supply end 20 and the load end 30 are coupled do not affect the execution of the foregoing step S51 to step S57. Therefore, the phase power supply path switching circuits 10 of the ninth embodiment to a sixteenth embodiment of the present disclosure are respectively the same as the phase power supply path switching circuits 10 of the foregoing first embodiment to the eighth embodiment.

An only difference is that the power supply end 20 and the load end 30 are both coupled in a star connection (Y connection).

Figure 17:
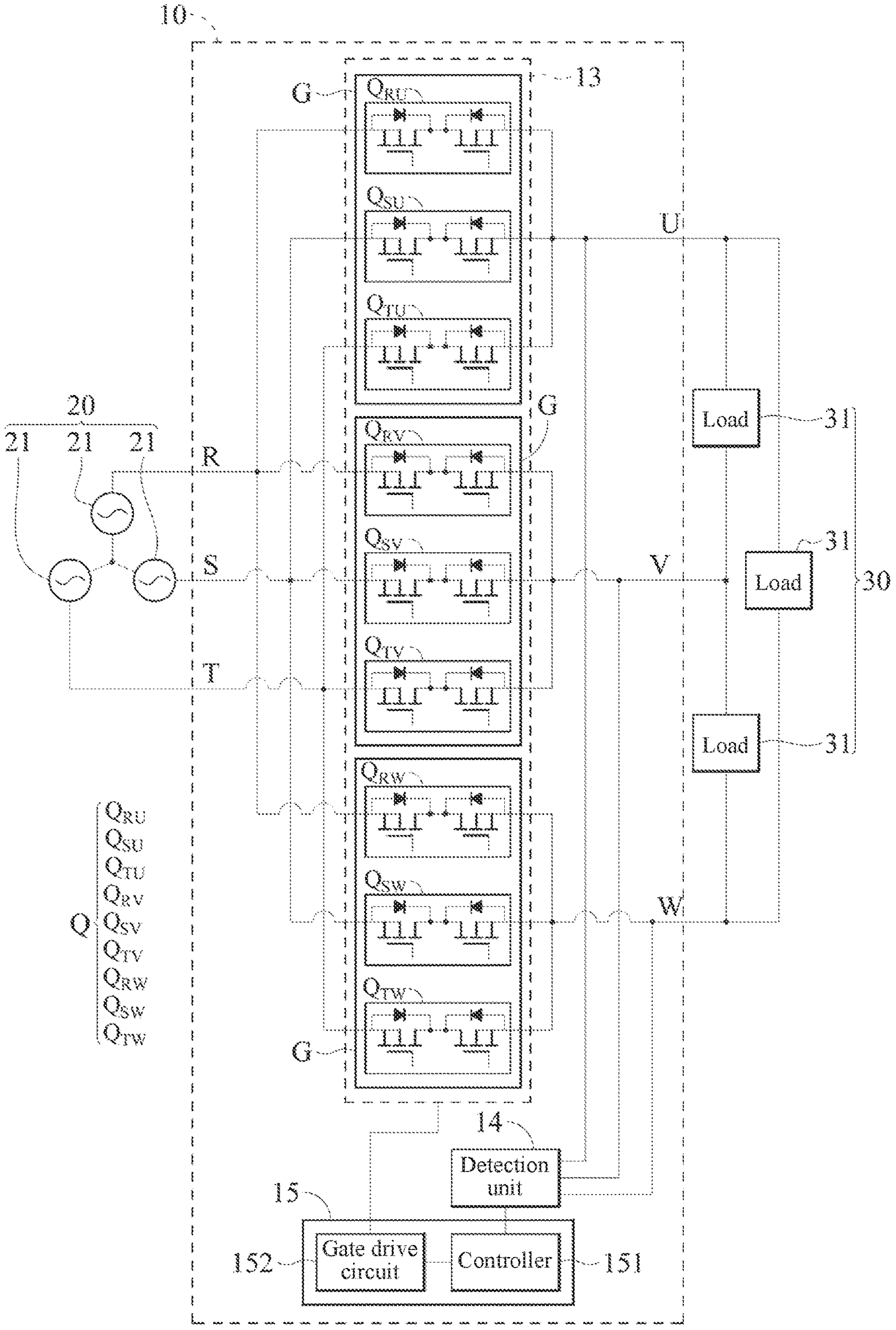
FIG. 17 is a circuit diagram of a phase power supply path switching circuit according to a seventeenth embodiment of the present disclosure.

FIG. 17 is a circuit diagram of a phase power supply path switching circuit 10 according to a seventeenth embodiment of the present disclosure. The seventeenth embodiment is mainly an example. In some embodiments, the three single-phase power supplies 21 included in the power supply end 20 are coupled in a star connection (Y connection), and the three loads 31 included in the load end 30 are coupled in a delta connection (A connection). Since the line voltages $V_{12}$, $V_{23}$, and $V_{31}$ are detected in the present disclosure, manners in which the power supply end 20 and the load end 30 are coupled do not affect the execution of the foregoing step S51 to step S57. Therefore, the phase power supply path switching circuits 10 of the eighteenth embodiment to a twenty-fourth embodiment of the present disclosure are respectively the same as the phase power supply path switching circuits 10 of the foregoing first embodiment to the eighth embodiment. An only difference is that the power supply end 20 is coupled in a star connection (Y connection) instead. For ease of understanding differences between the embodiments of the present disclosure, the differences are summarized in Table 5.

TABLE 5

| Embodiment | Connection architecture | Voltage detection | Line voltage $V_{YZ}$ | Bidirectional switch | Switch action |
|---|---|---|---|---|---|
| First | Δ-Δ | Load end | Positive half cycle | Common drain | Refer to Table 2 |
| Second | Δ-Δ | Load end | Negative half cycle | Common drain | Refer to Table 4 |
| Third | Δ-Δ | Load end | Positive half cycle | Common source | Refer to Table 4 |
| Fourth | Δ-Δ | Load end | Negative half cycle | Common source | Refer to Table 2 |
| Fifth | Δ-Δ | Power supply end | Positive half cycle | Common drain | Refer to Table 2 |
| Sixth | Δ-Δ | Power supply end | Negative half cycle | Common drain | Refer to Table 4 |
| Seventh | Δ-Δ | Power supply end | Positive half cycle | Common source | Refer to Table 4 |
| Eighth | Δ-Δ | Power supply end | Negative half cycle | Common source | Refer to Table 2 |
| Ninth | Y-Y | Load end | Positive half cycle | Common drain | Refer to Table 2 |
| Tenth | Y-Y | Load end | Negative half cycle | Common drain | Refer to Table 4 |
| Eleventh | Y-Y | Load end | Positive half cycle | Common source | Refer to Table 4 |
| Twelfth | Y-Y | Load end | Negative half cycle | Common source | Refer to Table 2 |
| Thirteenth | Y-Y | Power supply end | Positive half cycle | Common drain | Refer to Table 2 |
| Fourteenth | Y-Y | Power supply end | Negative half cycle | Common drain | Refer to Table 4 |
| Fifteenth | Y-Y | Power supply end | Positive half cycle | Common source | Refer to Table 4 |
| Sixteenth | Y-Y | Power supply end | Negative half cycle | Common source | Refer to Table 2 |
| Seventeenth | Y-Δ | Load end | Positive half cycle | Common drain | Refer to Table 2 |
| Eighteenth | Y-Δ | Load end | Negative half cycle | Common drain | Refer to Table 4 |
| Nineteenth | Y-Δ | Load end | Positive half cycle | Common source | Refer to Table 4 |
| Twentieth | Y-Δ | Load end | Negative half cycle | Common source | Refer to Table 2 |
| Twenty-first | Y-Δ | Power supply end | Positive half cycle | Common drain | Refer to Table 2 |
| Twenty-second | Y-Δ | Power supply end | Negative half cycle | Common drain | Refer to Table 4 |
| Twenty-third | Y-Δ | Power supply end | Positive half cycle | Common source | Refer to Table 4 |
| Twenty-fourth | Y-Δ | Power supply end | Negative half cycle | Common source | Refer to Table 2 |

Although the foregoing embodiments are described with a structure in which the bidirectional switches Q are all in common drain coupling or are all in common source coupling, in other embodiments, some of the bidirectional switches Q may be implemented with a common drain coupling structure, and another part of the bidirectional switches Q may be implemented with a common source coupling structure. In addition, switch control can be adjusted accordingly, and the foregoing step S54 to step S57 can still be implemented. Since there are many variations in combinations, examples are not listed one by one herein.

Although the foregoing embodiments describe determination of two time points (p1 and p2), it is not limited that the control unit 15 of the present disclosure should detect both the two time points (p1 and p2). The control unit 15 only needs to detect one of the two time points (p1 and p2).

Although the foregoing embodiments describe that the matrix switch unit 13 has nine bidirectional switches Q, a quantity of the bidirectional switches is not limited in the present disclosure. For example, if it is preset that only two specific phase lines (X, Y) need to be switched, bidirectional switches Q coupled to another phase line (Z) may be omitted. For example, in the foregoing embodiments, mutual switching is performed between the first phase line and the second phase line, then the bidirectional switches $Q_{TU}$, $Q_{TV}$, $Q_{RW}$ and $Q_{SW}$ related to the third phase line (coupled to the third phase input end T or/and the third phase output end W) may be omitted.

According to the phase power supply path switching circuit 10 of some embodiments of the present disclosure, only voltage detection needs to be performed and current detection does not need to be performed, and there is no need to consider a phase sequence of the three phase power supplies. A time point for switching is determined by detecting two line voltages, so that the phase power supply path switching circuit 10 is suitable for a variety of connection structures of the power supply end 20 and the load end 30, and has the convenience and versatility of universal plug and play. After a phase power supply path is switched, loads of two coupled phase lines are exchanged with each other, so that load balancing is achieved. In addition, through the foregoing switch switching sequence of the foregoing step S54 to step S57, short circuit of the power supply end 20 and open circuit of the load end 30 are avoided during path switching. Moreover, use of the bidirectional switches achieves effects such as fast switching and zero current switching (flexible switching).

What is claimed is:

1. A phase power supply path switching circuit, receiving three phase power supplies from a power supply end, wherein the phase power supply path switching circuit comprises:

three phase input ends, comprising a first phase input end, a second phase input end, and a third phase input end, respectively receiving the three phase power supplies from the power supply end;

three phase output ends, comprising a first phase output end, a second phase output end, and a third phase output end;

a matrix switch unit, comprising a plurality of bidirectional switches, each of the plurality of bidirectional switches is coupled between one of the three phase input ends and one of the three phase output ends, wherein the first phase input end and the first phase output end are coupled through a first bidirectional switch in the plurality of bidirectional switches to form a first phase line, and the second phase input end and the second phase output end are coupled through a second bidirectional switch in the plurality of bidirectional switches to form a second phase line;

a detection unit, configured to detect the first phase line, the second phase line, and a third phase line, wherein the third phase line is coupled between the third phase input end and the third phase output end; and a control unit, coupled to the detection unit and the matrix switch unit, and configured to, after receiving a switching signal indicative of a heavy-load condition on the first phase line or the second phase line, in response to detecting that a first line voltage between the first phase line and the second phase line is zero and a second line voltage between the second phase line and the third phase line is within a polarity half cycle, perform the following steps in sequence:

(a) turning off first conduction directions of the first bidirectional switch and the second bidirectional switch, wherein the first conduction direction is opposite to a current direction of the polarity half cycle;

(b) turning on second conduction directions of a third bidirectional switch and a fourth bidirectional switch in the polarity of bidirectional switches, wherein the second conduction direction is the same as the current direction of the polarity half cycle, the third bidirectional switch is coupled between the second phase input end and the first phase output end, and the fourth bidirectional switch is coupled between the first phase input end and the second phase output end;

(c) turning off second conduction directions of the first bidirectional switch and the second bidirectional switch; and (d) turning on first conduction directions of the third bidirectional switch and the fourth bidirectional switch.

2. The phase power supply path switching circuit according to claim 1, wherein the polarity half cycle is selected from a group comprising a positive half cycle and a negative half cycle.

3. The phase power supply path switching circuit according to claim 1, wherein each of the plurality of bidirectional switches comprises a first switch and a second switch connected in series, the first switch turns off the first conduction direction in a turn-off state, and the second switch turns off the second conduction direction in a turn-off state.

4. The phase power supply path switching circuit according to claim 3, wherein the first switch turns on the first conduction direction in a turn-on state, and the second switch turns on the second conduction direction in a turn-on state.

5. The phase power supply path switching circuit according to claim 4, wherein the first switch and the second switch are two power semiconductor switches connected in reverse series.

6. The phase power supply path switching circuit according to claim 5, wherein the power semiconductor switch is a metal-oxide-semiconductor field-effect transistor, the first switch and the second switch respectively have a source, a gate, and a drain, the drain of the first switch is coupled to the drain of the second switch, the source of the first switch and the source of the second switch are respectively coupled to a corresponding phase input end and a corresponding phase output end, and the gate of the first switch and the gate of the second switch are coupled to the control unit.

7. The phase power supply path switching circuit according to claim 6, wherein the polarity half cycle is the positive half cycle, the source of the first switch is coupled to the corresponding phase input end, and the source of the second switch is coupled to the corresponding phase output end.

8. The phase power supply path switching circuit according to claim 6, wherein the polarity half cycle is the negative half cycle, the source of the first switch is coupled to the corresponding phase output end, and the source of the second switch is coupled to the corresponding phase input end.

9. The phase power supply path switching circuit according to claim 5, wherein the power semiconductor switch is a metal-oxide-semiconductor field-effect transistor, the first switch and the second switch respectively have a source, a gate, and a drain, the source of the first switch is coupled to the source of the second switch, the drain of the first switch and the drain of the second switch are respectively coupled to a corresponding phase input end and a corresponding phase output end, and the gate of the first switch and the gate of the second switch are coupled to the control unit.

10. The phase power supply path switching circuit according to claim 9, wherein the polarity half cycle is the positive half cycle, the drain of the first switch is coupled to the corresponding phase output end, and the drain of the second switch is coupled to the corresponding phase input end.

11. The phase power supply path switching circuit according to claim 9, wherein the polarity half cycle is the negative half cycle, the drain of the first switch is coupled to the corresponding phase input end, and the drain of the second switch is coupled to the corresponding phase output end.

12. The phase power supply path switching circuit according to claim 3, wherein the first switch and the second switch are two power semiconductor switches connected in reverse series.

13. The phase power supply path switching circuit according to claim 12, wherein the power semiconductor switch is a metal-oxide-semiconductor field-effect transistor, the first switch and the second switch respectively have a source, a gate, and a drain, the drain of the first switch is coupled to the drain of the second switch, the source of the first switch and the source of the second switch are respectively coupled to a corresponding phase input end and a corresponding phase output end, and the gate of the first switch and the gate of the second switch are coupled to the control unit.

14. The phase power supply path switching circuit according to claim 13, wherein the polarity half cycle is the positive half cycle, the source of the first switch is coupled to the corresponding phase input end, and the source of the second switch is coupled to the corresponding phase output end.

15. The phase power supply path switching circuit according to claim 13, wherein the polarity half cycle is the negative half cycle, the source of the first switch is coupled to the corresponding phase output end, and the source of the second switch is coupled to the corresponding phase input end.

16. The phase power supply path switching circuit according to claim 12, wherein the power semiconductor switch is a metal-oxide-semiconductor field-effect transistor, the first switch and the second switch respectively have a source, a gate, and a drain, the source of the first switch is coupled to the source of the second switch, the drain of the first switch and the drain of the second switch are respectively coupled to a corresponding phase input end and a corresponding phase output end, and the gate of the first switch and the gate of the second switch are coupled to the control unit.

17. The phase power supply path switching circuit according to claim 16, wherein the polarity half cycle is the positive half cycle, the drain of the first switch is coupled to the corresponding phase output end, and the drain of the second switch is coupled to the corresponding phase input end.

18. The phase power supply path switching circuit according to claim 16, wherein the polarity half cycle is the negative half cycle, the drain of the first switch is coupled to the corresponding phase input end, and the drain of the second switch is coupled to the corresponding phase output end.

19. The phase power supply path switching circuit according to claim 1, wherein the detection unit is coupled to the three phase input ends.

20. The phase power supply path switching circuit according to claim 1, wherein the detection unit is coupled to the three phase output ends.

21. The phase power supply path switching circuit according to claim 1, where every three bidirectional switches form a switch group, and the matrix switch unit comprises three switch groups, wherein two ends of each of the plurality of bidirectional switches are respectively a first end and a second end, the first ends of the plurality of bidirectional switches of each of the three switch groups are coupled to the three phase input ends in a one-to-one manner, and the second ends of the plurality of bidirectional switches of each of the three switch groups are together coupled to one of the three phase output ends, so that each of the three switch groups is coupled to the three phase output ends in a one-to-one manner, wherein the third phase line is formed by coupling of the third phase input end to the third phase output end through a fifth bidirectional switch in the plurality of bidirectional switches.

* * * * *